United States Patent
Weldon

(10) Patent No.: US 10,073,812 B2
(45) Date of Patent: Sep. 11, 2018

(54) DIGITAL DISCRETE-TIME NON-FOSTER CIRCUITS AND ELEMENTS

(71) Applicant: Thomas P. Weldon, Charlotte, NC (US)

(72) Inventor: Thomas P. Weldon, Charlotte, NC (US)

(73) Assignee: THE UNIVERSITY OF NORTH CAROLINA AT CHARLOTTE, Charlotte, NC (US)

( * ) Notice: Subject to any disclaimer, the term of this patent is extended or adjusted under 35 U.S.C. 154(b) by 0 days.

(21) Appl. No.: 15/288,104

(22) Filed: Oct. 7, 2016

(65) Prior Publication Data

US 2017/0041010 A1 Feb. 9, 2017

Related U.S. Application Data

(63) Continuation of application No. PCT/US2015/027789, filed on Apr. 27, 2015.
(Continued)

(51) Int. Cl.
*H03M 1/06* (2006.01)
*G06F 17/10* (2006.01)
(Continued)

(52) U.S. Cl.
CPC .............. *G06F 17/10* (2013.01); *H03M 1/12* (2013.01); *H03M 1/66* (2013.01)

(58) Field of Classification Search
CPC ........ H03M 3/454; H03M 3/43; H03M 3/458; H03M 3/30; H03M 3/436; H03M 1/12;
(Continued)

(56) References Cited

U.S. PATENT DOCUMENTS 5,014,056 A * 5/1991 Moriwaki ............... H03M 1/14
341/155
5,347,279 A * 9/1994 Ishihara ............... H03M 3/356
341/143
(Continued)

FOREIGN PATENT DOCUMENTS

WO 2016/028354 A2 2/2016

OTHER PUBLICATIONS

Jul. 23, 2015 Search Report issued in International Patent Application No. PCT/US2015/027789.
(Continued)

*Primary Examiner* — Linh Nguyen
(74) *Attorney, Agent, or Firm* — Oliff PLC; R. Brian Drozd

(57) ABSTRACT

A method to implement circuits and circuit elements having one or more ports may include digitizing, using analog-to-digital converters, continuous-time input signals received from one or more ports of a circuit to form discrete-time input signals. At a digital signal processor, the discrete-time input signals are received and the discrete-time input signals are processed to calculate a desired discrete-time output signals. Using digital-to-analog converters, the calculated desired discrete-time output signal are calculated to form outputs of continuous-time output signals at the one or more ports of the circuit. The continuous-time output signals are output to the same one or more ports that receive the continuous-time input signals; and producing, thereby, a desired relationship between the continuous-time output signals and the continuous-time input signals at the one or more ports.

20 Claims, 19 Drawing Sheets

Related U.S. Application Data

(60) Provisional application No. 62/061,441, filed on Oct. 8, 2014, provisional application No. 61/984,377, filed on Apr. 25, 2014, provisional application No. 62/291,705, filed on Feb. 5, 2016.

(51) Int. Cl.
  *H03M 1/12* (2006.01)
  *H03M 1/66* (2006.01)

(58) Field of Classification Search
  CPC ........ H03M 1/00; H03M 3/49; H03M 7/3042; H03M 3/322; H03M 3/408; H03M 7/304; H03M 1/06; H03M 1/0626; H03M 3/334
  USPC .................. 341/143, 118, 120, 138–140, 155
  See application file for complete search history.

(56) References Cited

U.S. PATENT DOCUMENTS

| | | | | |
|---|---|---|---|---|
| 5,389,927 | A * | 2/1995 | Turney | H03M 1/182 341/138 |
| 6,121,940 | A | 9/2000 | Skahill et al. | |
| 6,359,575 | B1 | 3/2002 | Knudsen | |
| 6,369,730 | B1 | 4/2002 | Blanken et al. | |
| 6,462,685 | B1 * | 10/2002 | Korkala | H03M 3/334 241/131 |
| 7,626,527 | B1 * | 12/2009 | Wang | H03M 3/366 341/143 |
| 7,693,502 | B2 | 4/2010 | Sorrels et al. | |
| 8,374,561 | B1 | 2/2013 | Yung et al. | |
| 8,416,882 | B2 | 4/2013 | Corman et al. | |
| 8,604,982 | B2 | 12/2013 | Achour et al. | |
| 8,639,203 | B2 | 1/2014 | Robert et al. | |
| 8,988,173 | B2 | 3/2015 | Hitko et al. | |
| 2003/0085825 | A1 * | 5/2003 | Jensen | H03M 1/0673 341/143 |
| 2005/0027491 | A1 | 2/2005 | Fertner et al. | |
| 2006/0017595 | A1 * | 1/2006 | Van Veldhoven | H03M 3/348 341/143 |
| 2007/0216557 | A1 * | 9/2007 | Ebner | H03M 3/384 341/143 |
| 2008/0100485 | A1 * | 5/2008 | Tanaka | H03M 1/185 341/141 |
| 2008/0272946 | A1 * | 11/2008 | Melanson | H02M 1/4225 341/143 |
| 2008/0309536 | A1 * | 12/2008 | Le Guillou | H03M 3/346 341/143 |
| 2010/0283705 | A1 | 11/2010 | Achour et al. | |
| 2010/0328125 | A1 * | 12/2010 | Pagnanelli | H03M 3/468 341/143 |
| 2011/0200077 | A1 * | 8/2011 | Mitani | H03M 3/388 375/219 |
| 2012/0280843 | A1 * | 11/2012 | Tsai | H03M 3/37 341/110 |
| 2013/0009724 | A1 | 1/2013 | Xu et al. | |
| 2013/0035126 | A1 | 2/2013 | Kim et al. | |
| 2013/0065542 | A1 | 3/2013 | Proudkii | |
| 2013/0207737 | A1 | 8/2013 | Weldon et al. | |
| 2013/0293435 | A1 | 11/2013 | White et al. | |
| 2014/0266828 | A1 * | 9/2014 | Matsukawa | H03H 11/0433 341/143 |
| 2016/0218759 | A1 | 7/2016 | Robey et al. | |

OTHER PUBLICATIONS

Jul. 23, 2015 Written Opinion issued in International Patent Application No. PCT/US2015/027789.

Weldon et al; "Stability of Embedded Non-Foster Metamaterials with Potentially Unstable Circuit Parameters;" 7th International Congress on Advanced Electromagnetic Materials in Microwaves and Optics—Metamaterials 2013; Sep. 16-21, 2013; 3 pp.; Retrieved from http://coefs.uncc.edu/tpweldon/files/2014/07/meta2013_tpw_12jul2013_p_ppt. pdf.

Song; "Non-Foster Impedance Matching and Loading Networks for Electrically Small Antennas" (dissertation); Retrieved from https://etd.ohiolink.edu/!etd.send_file?accession=osu1308313555 &disposition=inline.

Sievenpiper et al; "Materials and Components With a Negative Frequency Derivative of Reactance" [PowerPoint slides]; Retreived from https://www.e3s-center.org/pubs/106/PEB2012_7_DSievenpiper_Webfinal.pdf.

Weldon et al; "Stability Conditions for a Digital Discrete-Time Non-Foster Circuit Element;" IEEE Int. Sympo. on Ant. and Prop.; Vancouver, BC, Canada; Jul. 19-25, 2015; 2 pp.

Weldon et al; "A Two-Port Digital Discrete-Time Non-Foster Circuit Designed for Negative Capacitance;" IEEE; 9th Intl. Cong. on Adv. Electromagnetic Mat. in Microw. and Optics—Metamaterials 3026; Oxford, UK; Sep. 7-12, 2015; 3 pp.

Weldon et al; "Performance of Digital Discrete-Time Implementations of Non-Foster Circuit Elements;" IEEE; 2015 IEEE Int. Symp. on Circuits and Systems; Libson, Portugal; May 24-27, 2015; 4 pp.

Weldon et al; "A Digital Discrete-Time Non-Foster Approach to Broadband Fast-Wave Microstrip Lines;" IEEE; 9th Int. Cong. on Adv. Electromagnetic Mat. in Microw. and Optics—Metamaterials 2015; Oxford, UK; Sep. 7-12, 2015; 3 pp.

Smith et al; "A Digital Non-Foster Fast-Wave Line with an Internet of Things Approach for Signal Monitoring and Tuning of Multiple Negative Capacitors;" submitted Sep. 6, 2016 to the 42nd IEEE International Conference on Acoustics, Speech and Signal Processing held Mar. 5-9, 2017.

Kehoe et al; "Stability Analysis and Measurement of RC and RL Digital Non-Foster Circuits with Latency;" submitted Sep. 9, 2016 to the 42nd IEEE International Conference on Acoustics, Speech and Signal Processing held Mar. 5-9, 2017.

Steer et al; "Investigation of an Adaptively-Tuned Digital Non-Foster Approach for Impedance Matching of Electrically-Small Antennas;" submitted Sep. 9, 2016 to the 42nd IEEE International Conference on Acoustics, Speech and Signal Processing held Mar. 5-9, 2017.

"A Digital Discrete-Time Non-Foster Design Method for Fast-Wave Coaxial Lines with Measurement of a Low-Frequency Prototype;" submitted to the May 22-27, 2016 International Microwave Symposium IMS2016 by T. Weldon of the University of North Carolina at Charlotte.

Design of Digital Discrete-Time Non-Foster Rl Circuits with Proof-of-Concept Measurements at Low Frequency; submitted to the May 22-27, 2016 International Microwave Symposium IMS2016 by T. Weldon of the University of North Carolina at Charlotte.

Kehoe et al; "Thevenin Forms of Digital Discrete-Time Non-Foster RC and RL Circuits;" submitted to the Jun. 26-Jul. 1, 2016 AP-S/URSI Conference by T. Weldon of the University of North Carolina at Charlotte.

Steer et al; "Effects of Latency and Quantization Noise on Digital Discrete-Time Non-Foster Circuits;" submitted to the Jun. 26-Jul. 1, 2016 AP-S/URSI Conference by T. Weldon of the University of North Carolina at Charlotte.

Smith et al; "Measurement of a Fast-Wave Line Using Digital Non-Foster Circuits for Software-Adjustable Delay;" submitted to the Jun. 26-Jul. 1, 2016 AP-S/URSI Conference by T. Weldon of the University of North Carolina at Charlotte.

Major et al; "Simulation and Measurement of an Internet of Things Implementation of a Programmable Digital Inductor;" submitted to the Mar. 30-Apr. 3, 2016 IEEE SoutheastCon 2016 by T. Weldon of the University of North Carolina at Charlotte.

* cited by examiner

US 10,073,812 B2

DIGITAL DISCRETE-TIME NON-FOSTER CIRCUITS AND ELEMENTS

CROSS-REFERENCE TO RELATED APPLICATIONS

This is a continuation of International Application No. PCT/US2015/027789 filed Apr. 27, 2015, and claims the benefit of priority to U.S. Provisional Application No. 61/984,377 filed on Apr. 25, 2014, to U.S. Provisional Application No. 62/061,441 filed on Oct. 8, 2014, and U.S. Provisional Application No. 62/291,705 filed Feb. 5, 2016, all of which are incorporated herein in their entireties.

STATEMENT ABOUT FEDERALLY SPONSORED RESEARCH OR DEVELOPMENT

This invention was made with Government support under award number ECCS-1101939 by the National Science Foundation. The Government has certain rights in the invention.

BACKGROUND

Non-Foster circuits and non-Foster circuit elements are of particular interest in electromagnetics, metamaterials, and antenna applications. Such circuits are useful to increase bandwidth of systems and to perform functions not possible in naturally-occurring circuits and devices. However, non-Foster circuits are heretofore only available using analog circuits and may have some concomitant shortcomings, including not being stable.

SUMMARY OF INVENTION

Embodiments of the present application pertain to the use of signal processing and discrete-time methods and circuits to implement non-Foster elements and non-Foster circuits having one or more ports, and with options for adaptive control of the circuits.

According to one aspect, provided herein are digital discrete-time implementations of non-Foster circuits, such as negative capacitors and negative inductors. According to another aspect, adaptive controllers may be employed to stabilize non-Foster circuits and adapt to variations in externally-connected circuits. According to another aspect, two-port or multi-port discrete-time implementations of non-Foster circuits may be employed. According to another aspect, a voltage is measured at one port and the current at the very same port is forced to be a desired value, as determined by digital signal processing. According to another aspect, a current is measured at one port and the voltage at the very same port is forced to be a desired value, as determined by digital signal processing.

According to one embodiment, a method to implement circuits and circuit elements having one or more ports may include digitizing, using analog-to-digital converters, continuous-time input signals received from one or more ports of a circuit to form discrete-time input signals. At a digital signal processor, the discrete-time input signals are received and the discrete-time input signals are processed to calculate a desired discrete-time output signals. Using digital-to-analog converters, the calculated desired discrete-time output signal are calculated to form outputs of continuous-time output signals at the one or more ports of the circuit. The continuous-time output signals are output to the same one or more ports that receive the continuous-time input signals; and producing, thereby, a desired relationship between the continuous-time output signals and the continuous-time input signals at the one or more ports.

According to another embodiment, an apparatus to implement circuits and circuit elements having one or more ports may include: analog-to-digital converters at every port to convert continuous-time input signals received from each port of a circuit into corresponding discrete-time input signals; a digital signal processor to process and compute desired discrete-time output signals for each port from the said discrete-time input signals;

digital-to-analog converters at each port to convert the desired discrete-time output signals to continuous-time output signals at each port; and outputs of said digital-to-analog converters connected to the inputs of said analog-to-digital converters at every port. The continuous time output signals may be currents when said continuous-time input signals are voltages, and the continuous time output signals may be voltages when said continuous-time input signals are currents.

BRIEF DESCRIPTION OF DRAWINGS

Aspects of the present invention are further described in the detailed description which follows in reference to the noted plurality of drawings by way of non-limiting examples of embodiments of the present invention in which like reference numerals represent similar parts throughout the several views of the drawings and wherein.

DETAILED DESCRIPTION

Non-Foster circuit elements and non-Foster circuits, as described herein, may be used in a variety of applications such as magnetic conductors, wideband antennas, metamaterials, and bandwidth enhancement of many circuits. Non-Foster circuit elements could include devices such as negative capacitors, negative inductors, and negative resistors. In prior art, non-Foster circuits may employ negative impedance converters (NIC) and negative impedance inverters (NII) comprised of a variety of continuous-time analog current conveyor circuits or continuous-time analog transistor circuits. Embodiments described herein may pertain to the use of digital signal processing and discrete-time methods and circuits to implement non-Foster elements and non-Foster circuits having one or more ports (e.g., connection points, etc.), and with options for adaptive control of the circuits. The digital signal processing and discrete-time approach offers significant advantages such as low cost, repeatability, scalability, and ease of incorporation of adaptive control methods and adaptive stabilization methods. Digital signal processing is commonly carried out using logic circuits and microcontrollers, but discrete-time signal processing may also be implemented in analog hardware, in delay lines, in analog signal samplers, in digital circuits, in software, or in combinations of these means. Digital discrete-time implementations of non-Foster circuits, such as negative capacitors and negative inductors are described herein as one aspect of the present application. Adaptive controllers to stabilize non-Foster circuits are also described herein as another aspect of the present application. Adaptive controllers to adapt non-Foster circuits to variations in external circuits are also described herein as another aspect of the present application. Discrete-time implementations of non-Foster circuits having two or more ports are also described herein as another aspect of the present application. A variety of embodiments are presented to illustrate the invention, but it should be understood that these embodiments are merely illustrative, and the present invention is not intended to be limited to these exemplary embodiments.

Figure 1:
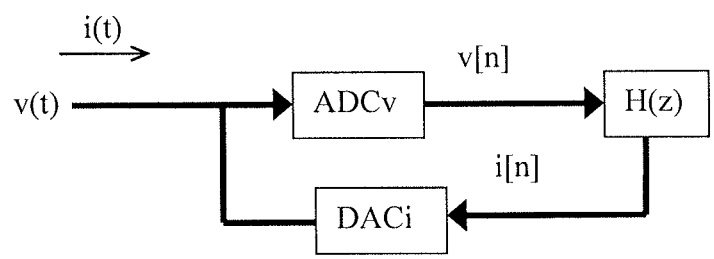
FIG. 1 shows a diagrammatic illustration of a non-Foster element according to an embodiment.

In a first embodiment illustrated in FIG. 1, an analog continuous-time input voltage v(t) with Laplace transform V(s) is converted to a digital discrete-time signal v[n] by an analog-to-digital voltage converter (ADCv) with clock period T, processed digitally with a discrete-time system having impulse response h[n] with z-transform H(z) (e.g., an example of a digital signal processor (DSP)) having output discrete-time signal i[n]=v[n]*h[n] (with * denoting convolution), so I(z)=H(z)V(z), and finally discrete-time signal i[n] is converted to an analog continuous-time output current i(t) (e.g., an example of a desired current at the port of the non-Foster circuit/element) with Laplace transform I(s) by a digital-to-analog current converter (DACi) with clock period T. It should be understood that signals may be chosen to be single-ended or differential in implementation. For this embodiment:

$$I(s)=V^*(s)\ \{H(z)(1-z^{-1})/s\ \}|_{z=exp(sT)}=\Sigma V(s-j2m\pi/T)/T$$
$$\{H(z)(1-z^{-1})/s\}|_{z=exp(sT)}$$

for integer m, and where the starred transform is $V^*(s)=\Sigma v(nT)e^{-nsT}$ for integer n.

For signals sampled without aliasing, the input impedance below the Nyquist frequency becomes:

$$Z(s)=V(s)/I(s)\approx\{sT/[(1-z^{-1})H(z)]\}|_{z=exp(sT)}=sT/[H(e^{-sT})(1-e^{-sT})],$$

for frequencies below 0.5/T Hz, assuming a zero-order hold (ZOH) incorporated into the DACi, and where the continuous-time frequency response at low frequencies can be approximated as $H(\omega)\approx H(z)|_{z=exp(j\omega T)}$. In this embodiment, an example of digital signal processing defined through H(z) is now given for a negative or positive capacitance. Since a capacitor has i(t)=Cdv(t)/dt and I(s)=sCV(s), a positive or negative capacitor may be approximated by using the discrete-time backward-difference approximation of the derivative dv(t)/dt≈(v[n]−v[n−1])/T and setting i[n]=C(v[n]−v[n−1])/T, or equivalently setting $I(z)=C(1-z^{-1})V(z)/T$. Since I(z)=H(z)V(z) in FIG. 1, $H(z)=C(1-z^{-1})/T$, thus establishing the necessary digital signal processing. Alternatively, a positive or negative capacitor may be approximated by using the bilinear transform of I(s)=sCV(s), replacing s by 2(z−1)/{(z+1)T} yielding I(z)=2C V(z)(z−1)/{(z+1)T}, so H(z)=2C(z−1)/{(z+1)T} in FIG. 1, thus establishing an alternative digital signal processing. Similarly in this embodiment, since an inductor has i(t)=i(0)+∫v(t)dt/L and I(s)=V(s)/(sL), a positive or negative inductor may be approximated by using the discrete-time accumulator approximation to integral i(0)+∫v(t)dt/L≈i[0]+Σv[n]T/L, and setting i[n]=i[n−1]+Tv[n]/L, or equivalently setting I(z)=T V(z)/(L−$z^{-1}$L), so H(z)=T/(L−$z^{-1}$L) in FIG. 1. Alternatively, a positive or negative inductor may be approximated by using the bilinear transform approximation of the relation I(s)=V(s)/(sL), replacing s by 2(z−1)/{(z+1)T} and yielding I(z)=TV(z)(z+1)/{2L(z−1)}, so H(z)=T(z+1)/{2L(z−1) } in FIG. 1. It should be understood that any Foster or non-Foster impedance Z(s) may be approximated by appropriate selection of discrete-time signal processing system H(z) or h[n], where such discrete-time signal processing may be accomplished in hardware, software, or combination of hardware and software. As illustrated in FIG. 1 and the foregoing example, preferentially the ADCv would have high input impedance and DACi would have high output impedance, for simplicity in exposition, such that the current into the ADCv would be approximately zero and the port current approximately equal to the DACi output current.

Figure 2:
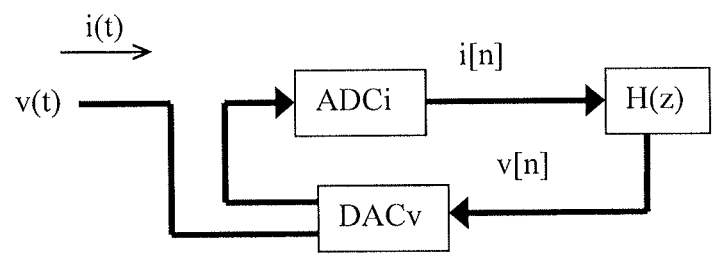
FIG. 2 shows a diagrammatic illustration of a non-Foster element according to an embodiment.

In a second embodiment illustrated in FIG. 2, an analog continuous-time input current i(t) with Laplace transform I(s) is converted to a digital discrete-time signal i[n] by an analog-to-digital current converter (ADCi) with clock period T, processed digitally with a discrete-time system having impulse response h[n] and z-transform H(z) (e.g., a DSP), having output discrete-time signal v[n]=i[n]*h[n] (with * denoting convolution), so V(z)=H(z)I(z), and finally discrete-time signal v[n] is converted to an analog continuous-time output voltage v(t) with Laplace transform V(s) by a digital-to-analog voltage converter (DACv) with clock period T. It should be understood that signals may be chosen to be single-ended or differential in implementation. For this embodiment, $$V(s)=I^*(s)\{H(z)(1-z^{-1})/s\}|_{z=exp(sT)}=\Sigma I(s-j2m\pi/T)/T\{H(z)(1-z^{-1})/s\}|_{z=exp(sT)}$$

for integer m, and where starred transform $I^*(s)=\Sigma i(nT)e^{-nsT}$ for integer n. For signals sampled without aliasing, the input impedance below the Nyquist frequency becomes:

$$Z(s)=V(s)/I(s)\approx\{H(z)(1-z^{-1})/(sT)\}|_{z=exp(sT)}=H(e^{-sT})(1-e^{-sT})/(sT),$$

for frequencies below 0.5/T Hz, assuming a zero-order hold (ZOH) incorporated into the DACv, and where the continuous-time frequency response at low frequencies can be approximated as $H(\omega)H(z)|_{z=exp(j\omega T)}$. In this embodiment, since an inductor has v(t)=Ldi(t)/dt and V(s)=sLI(s), a positive or negative inductor may be approximated by using the discrete-time backward-difference approximation of the derivative di(t)/dt≈(i[n]−i[n−1])/T and setting v[n]=L(i[n]−i[n−1])/T, or equivalently setting V(z)=L(1−z$^{-1}$)I(z)/T. Since V(z)=H(z)I(z) in FIG. 2, H(z)=L(1−z$^{-1}$)/T. Alternatively, a positive or negative inductor may be approximated by using the bilinear transform of V(s)=sLI(s), replacing s by 2(z−1)/{(z+1)T} yielding V(z)=2LI(z)(z−1)/{(z+1)T}, so H(z)=2L(z−1)/{(z+1)T} in FIG. 2. Similarly in this embodiment, since a capacitor has v(t)=v(0)+∫i(t)dt/C and V(s)=I(s)/(sC), a positive or negative capacitor may be approximated by using the discrete-time accumulator approximation to the integral v(0)+∫i(t)dt/C≈v[0]+Σi[n] T/C, and setting v[n]=v[n−1]+Ti[n]/C, or equivalently setting V(z)=TI(z)/(C−z$^{-1}$C), so H(z)=T/(C−z$^{-1}$C) in FIG. 2. Alternatively, a positive or negative capacitor may be approximated by using the bilinear transform of the relation V(s)=I(s)/(sC), replacing s by 2(z−1)/{(z+1)T} and yielding V(z)=TI(z)(z+1)/{2C(z−1)}, so H(z)=T(z+1)/{2C(z−1)} in FIG. 2. It should be understood that any Foster or non-Foster impedance Z(s) may be approximated by appropriate selection of discrete-time signal processing system H(z) or h[n], where such discrete-time signal processing may be accomplished in hardware, software, or combination of hardware and software. As illustrated in FIG. 2 and the foregoing example, preferentially the ADCi would have low input impedance and DACv would have low differential output impedance, for simplicity in exposition, such that the voltage drop across the ADCi would be approximately zero and the port voltage approximately equal to the DACv output voltage.

It should be understood in the embodiments of FIG. 1 and FIG. 2 that a zero-order hold may be replaced by first-order hold, fractional-order hold, perfect reconstruction filters, and the like. It should be understood that the linear time-invariant system H(z) with impulse response h[n] in the embodiments of FIG. 1 and FIG. 2 may be replaced by nonlinear systems, time invariant systems, and other general-purpose systems to achieve the desired relationship of i(t) and v(t) at the input port. It should be understood that the embodiments of FIG. 1 and FIG. 2 may be used to implement circuits that satisfy Foster's theorem, in addition to non-Foster circuits.

Figure 3:
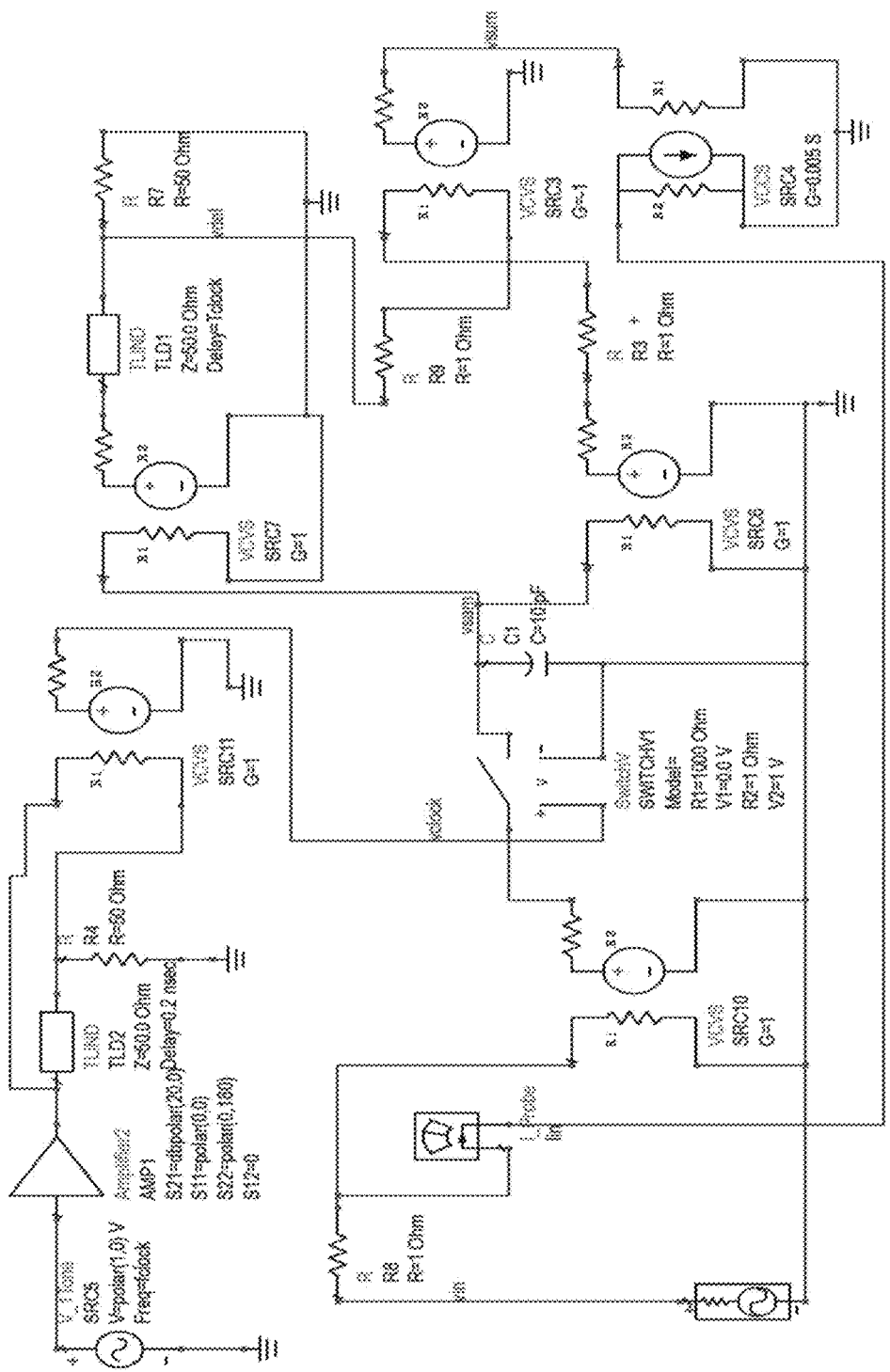
FIG. 3 shows a diagrammatic illustration and simulation of a circuit having at least one non-Foster element according to an embodiment.

FIG. 3 is a Keysight ADS simulation schematic of the configuration of FIG. 1, with delay lines, sampler switch, and hold capacitor C1 used to simulate sampling at 1 GHz, T=1 ns, with i[n]=C(v[n]−v[n−1])/T=−0.005(v[n]−v[n−1]), so design value is C=0.005T=−5 pF. This simulation schematic is discussed in more detail below.

Figure 4:
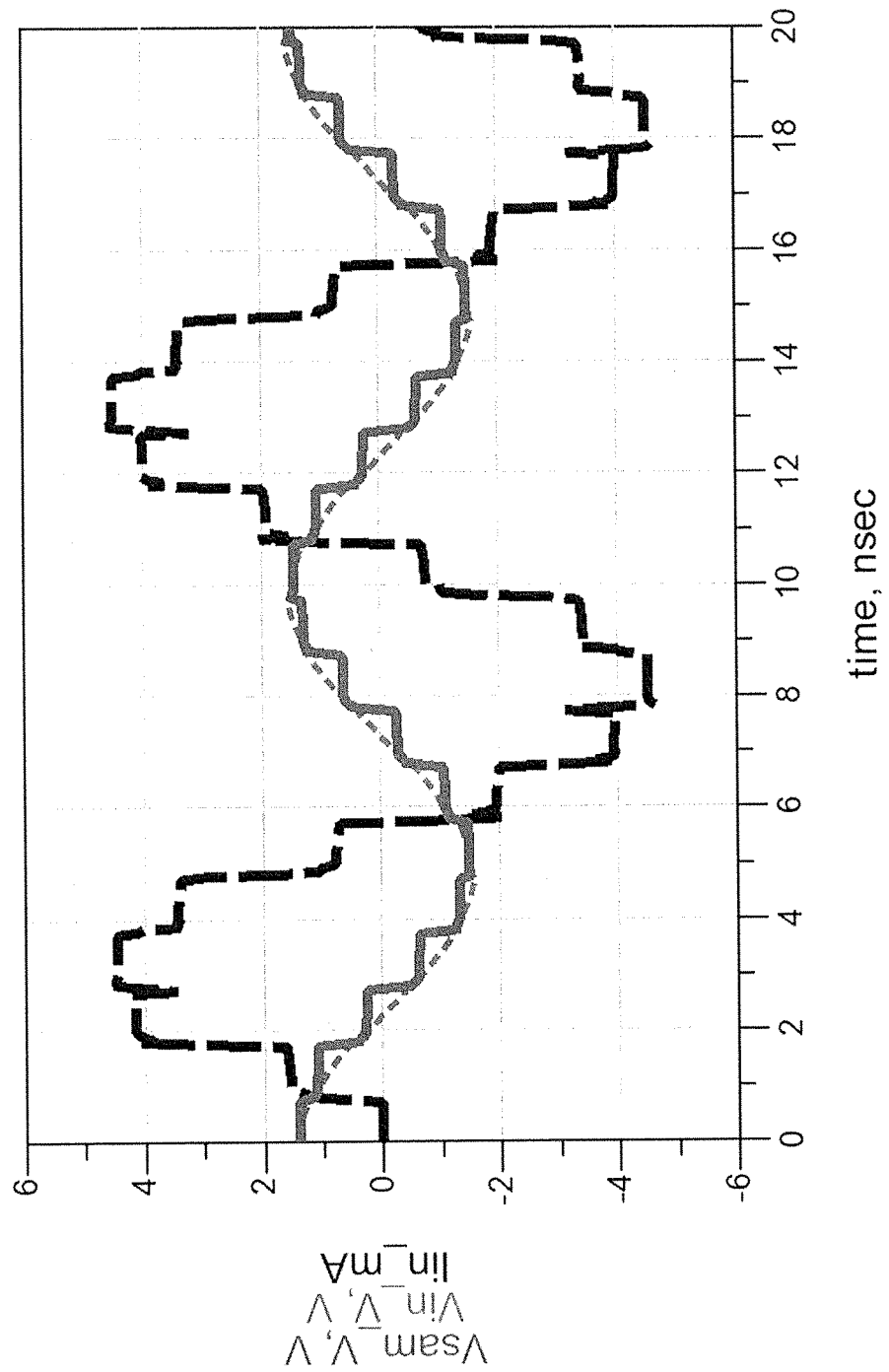
FIG. 4 shows a graph of a time-domain simulation of the circuits of FIGS. 1 and 3 according to one embodiment.
Figure 5:
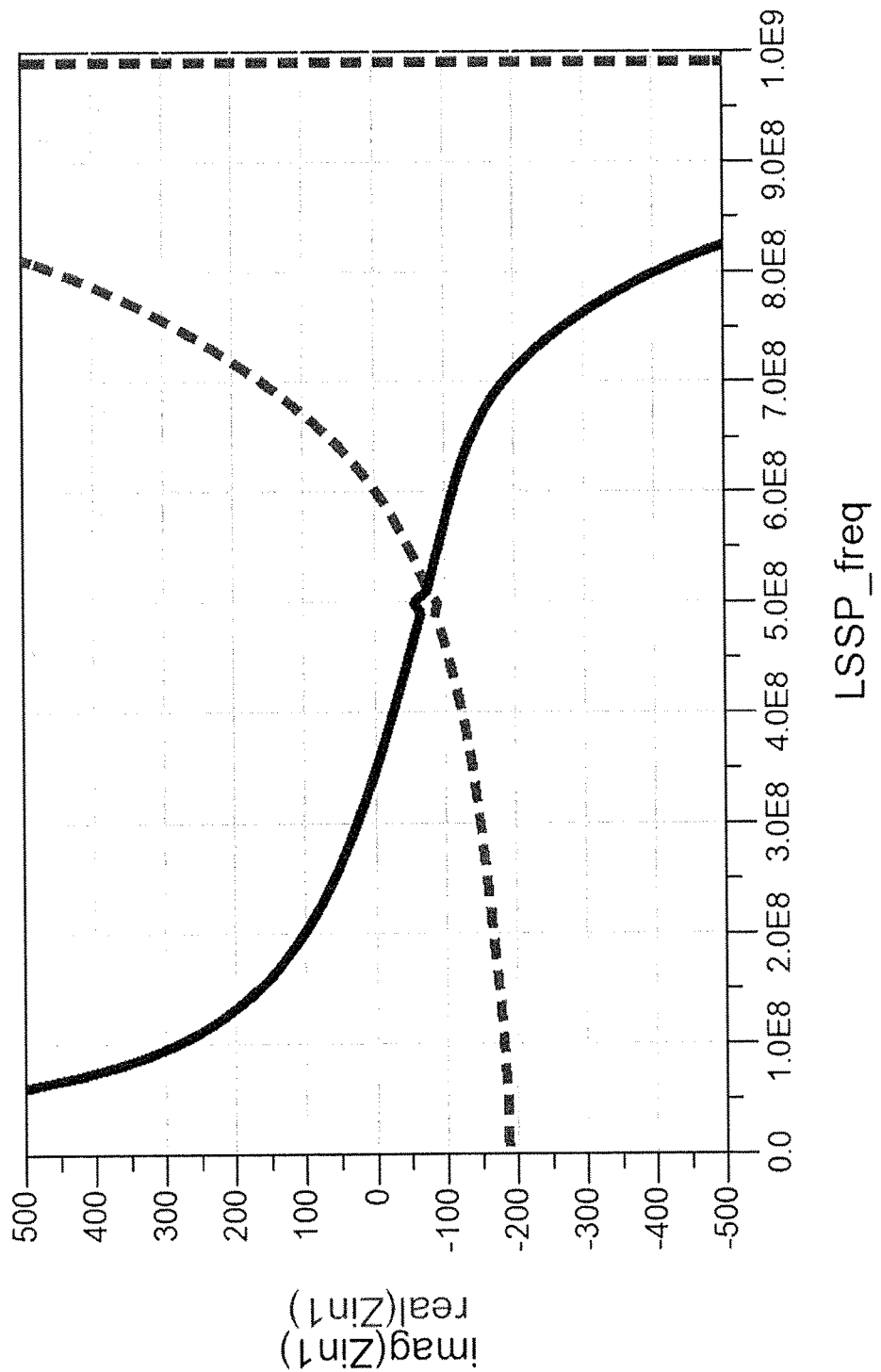
FIG. 5 shows a graph of real and imaginary port impedance for a large-signal s-parameter simulation of the circuit of FIGS. 1 and 3 according to one embodiment.

An example negative capacitance implementation of the configuration of FIG. 1 is illustrated in the Keysight ADS schematic of FIG. 3. The Keysight ADS software offers large signal s-parameters for microwave impedance measurement, but does not appear to have convenient means for mixed-signal simulation; therefore, the ADCv of FIG. 1 is implemented as switch V1 and hold capacitor 0Iin FIG. 3, the unit delay is simulated by 1 ns delay line TLD1, the discrete-time subtraction v[n]−v[n−1] is performed by voltage-controlled voltage source SRC3, and finally the DACi is implemented with voltage-controlled current source SRC4 having transconductance 0.005S. SRC6, SRC7, and SRC10 are unity-gain voltage buffers, and the input of delay line TLD1 corresponds to v[n] and output of TLD1 corresponds to v[n−1]. The switch V1 and hold capacitor C1 are used under control of clock oscillator SRC5 to simulate sampling at 1 GHz, and T=1 ns. From the foregoing theory for a capacitance C, i[n]=C(v[n]−v[n−1])/T and in the circuit of FIG. 3, i[n]=−0.005(v[n]−v[n−1]), resulting a design value of C=−0.005T=−5 pF. The Keysight ADS time-domain simulation of the circuit of FIG. 3 is shown in FIG. 4, with red dotted input voltage v(t) at 100 MHz, green solid sampled input voltage v[n], and blue dashed input current i(t) in mA. From the peak input current of 4.4 mA and peak input voltage of 1.5 V, the magnitude of the impedance is approximately 341 ohms at the 100 MHz signal frequency, versus a predicted impedance of +j318 ohms for −5 pF. Finally, FIG. 5 shows a Keysight ADS large-signal s-parameter simulation of the configuration of FIG. 1 and schematic of FIG. 3, with T=1 ns and C=−5 pF. The dashed red curve is the real part of the input impedance Z(s), and the solid blue curve is the imaginary part of the input impedance Z(s). The predicted impedance is approximately +j318 ohms for −5 pF at 100 MHz, and the observed impedance of −182+j282 ohms at 100 MHz, corresponds to 5.6 pF in series with −182 ohms, versus a predicted impedance of +j318 and −5 pF. The resistive part of the impedance is partially due to the phase contribution of the zero order hold in the implementation. It should be understood that the zero-order hold contributes a time delay of approximately one half clock period, or 0.5 ns in FIG. 3, corresponding to a phase lag of 2π(0.5)/10=0.31 rad or 18 degrees in i(t). For small angles the effect of phase lag can be estimated as +j318/e$^{-0.31}$=−97+j303 ohms. A better predicted value of parasitic resistance can be calculated from the relation Z(s)={sT/[(1−z$^{-1}$)H(z)]}|$_{z=exp(sT)}$={sT/[(1−Z$^{-1}$)C(1−Z$^{-1}$)/T]}|$_{z=exp(sT)}$=−193+j266, and is in good agreement with the simulation results of of −182j282 ohms at 100 MHz. In addition, the shape of the reactance (solid blue curve) in FIG. 5 follows the expected inverse frequency dependence of Im{Z(jω)}=+1/(ω|C|) for a negative capacitor.

As mentioned above, FIG. 4 illustrates a Keysight ADS time-domain simulation of the configuration of FIG. 1 and schematic of FIG. 3, with T=1 ns and C=−5 pF, and predicted impedance of +j318 ohms. The dotted line is input voltage v(t), solid curve is sampled input voltage v[n], and dashed line is input current i(t) in mA. Peak input current is 4.4 mA, peak input voltage is 1.5 V, with approximate impedance magnitude of 341 ohms at the 100 MHz signal frequency.

FIG. 5 illustrates a Keysight ADS large-signal s-parameter simulation of the configuration of FIG. 1 and schematic of FIG. 3, with T=1 ns and C=−5 pF. The dashed curve is real part of input impedance Z(s), and solid curve is imaginary part of input impedance Z(s). The predicted impedance is +j318 ohms for −5 pF at 100 MHz, and the observed impedance is −182+j282 ohms at 100 MHz, or −5.6 pF in series with −182 ohms. In addition, the shape of the reactance follows the expected inverse frequency dependence of $Im\{Z(j\omega)\}=+1/(\omega|C|)$ for a negative capacitor.

Figure 6:
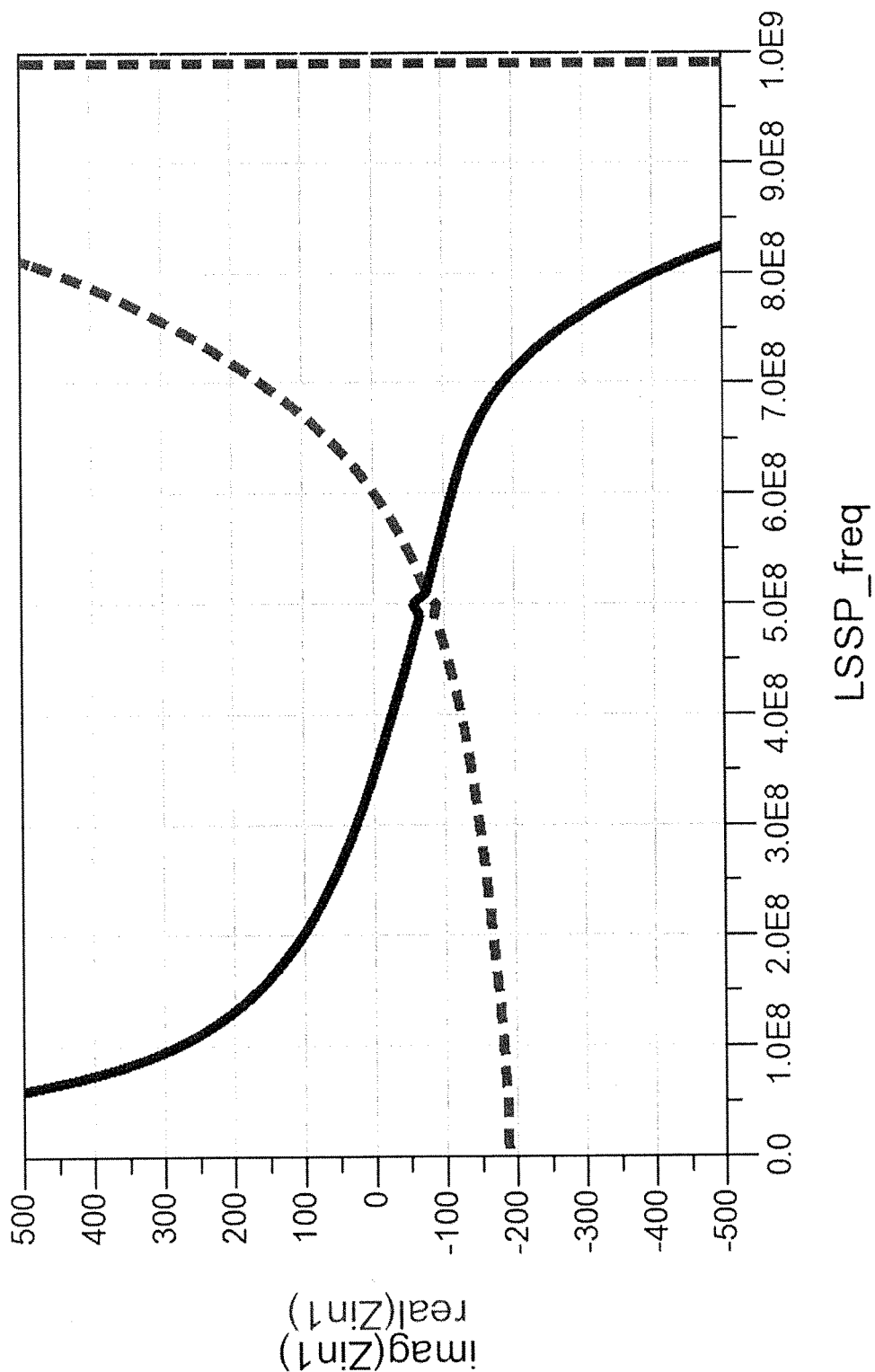
FIG. 6 shows a graph of real and imaginary port impedance for a large-signal s-parameter simulation of the circuit of FIGS. 1 and 3 according to another embodiment.

At low frequencies, the example implementation of FIG. 3 has a predictable and controllable series resistance, where $Z(s)=I(s)/V(s)=\{sT/[(1-Z^{-1})H(Z)]\}|_{z=exp(sT)}=\{sT/[(1-z^{-1})C(1-z^{-1})/T]\}|_{z=exp(sT)}\approx sT^2/\{(sT)^2Ce^{-sT}\}=e^{j\omega T}/(j\omega C)\approx 1/(j\omega C)+T/C$. And so the parasitic resistance $R_p$ at low frequency is approximately $R_p\approx T/C$, which in FIG. 3 and FIG. 5 would be $R_p\approx 10^{-9}/(-5\times 10^{-12})=-200$ ohms, quite close to the low frequency value in FIG. 5. The designer is then free to reduce the magnitude of the low-frequency parasitic resistance by reducing T or increasing C. To illustrate this design freedom, the circuit of FIG. 3 is modified to reduce the series resistance by increasing the clock to 2 GHz, so T=0.5 ns, and increasing transconductance of SRC4 to 0.01 S, so that the capacitance remains at C=−5 pF, as before. Simulation results of the modified circuit are shown in FIG. 6, where the magnitude of the resistance at low frequency is reduced with Z=−69+j315 ohms at 100 Mz, compared to the previous value of −182+j282 ohms in FIG. 5. It should be understood that the designer may further compensate for desired Foster and non-Foster impedance characteristics as a function of frequency by proper design of H(z) using a variety of methods such as least-squares, Pade methods, Prony methods, bilinear transform, impulse invariance, and other such design methods for H(z).

FIG. 6 illustrates a Keysight ADS large-signal s-parameter simulation of the configuration of FIG. 1 and schematic of FIG. 3, modified with T=0.5 ns and C=−5 pF. The dashed curve is real part of input impedance Z(s), and the blue curve is imaginary part of input impedance Z(s). The predicted impedance is approximately +j318 ohms for −5 pF at 100 MHz, and the observed impedance is −69+j315 ohms at 100 MHz, or −5.1 pF in series with −69 ohms. In addition, the shape of the reactance follows the expected inverse frequency dependence of $Im\{Z(j\omega)\}=+1/(\omega|C|)$ for a negative capacitor.

Figure 7:
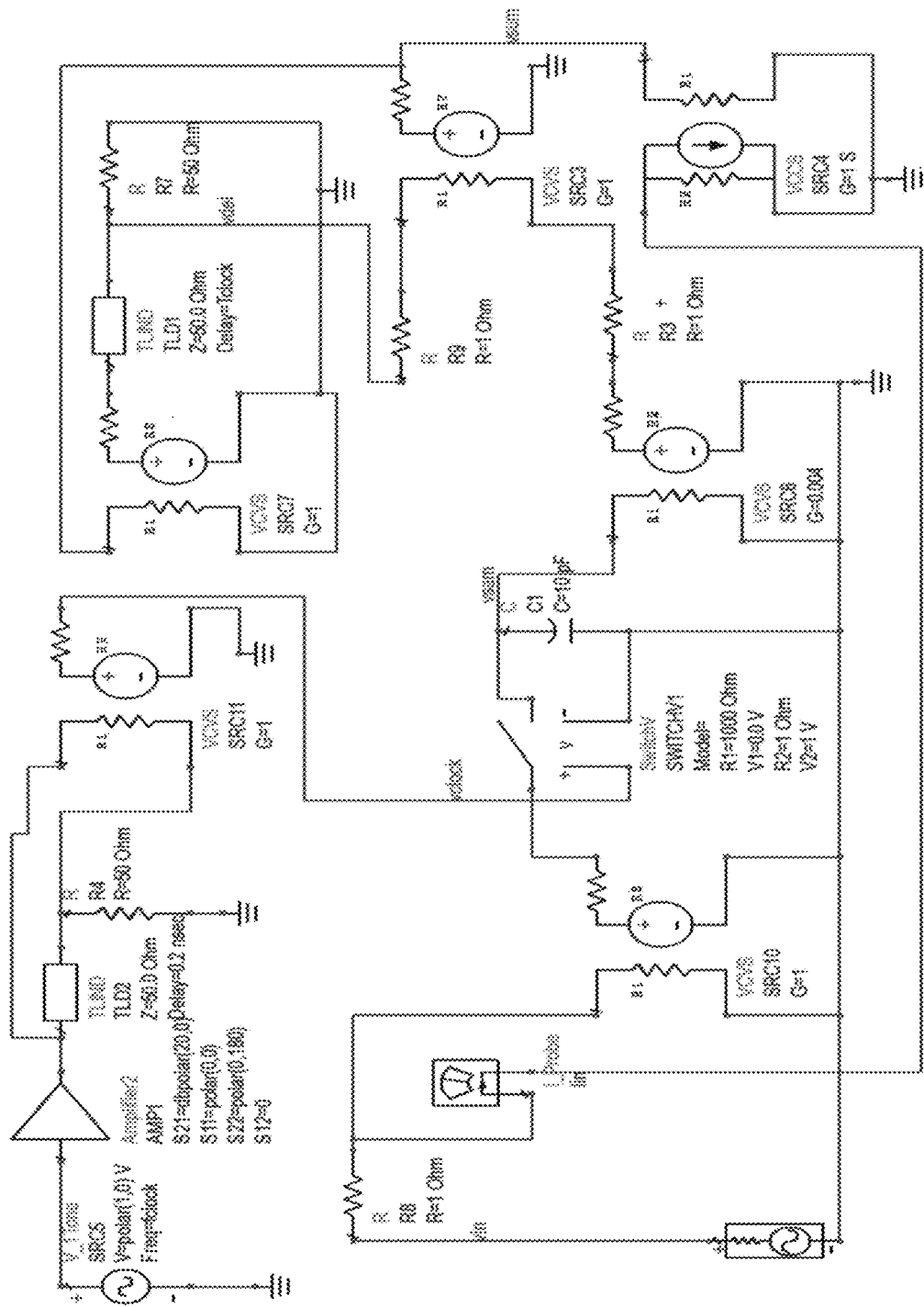
FIG. 7 shows a diagrammatic illustration and simulation of a circuit having at least one non-Foster element according to an embodiment.
Figure 8:
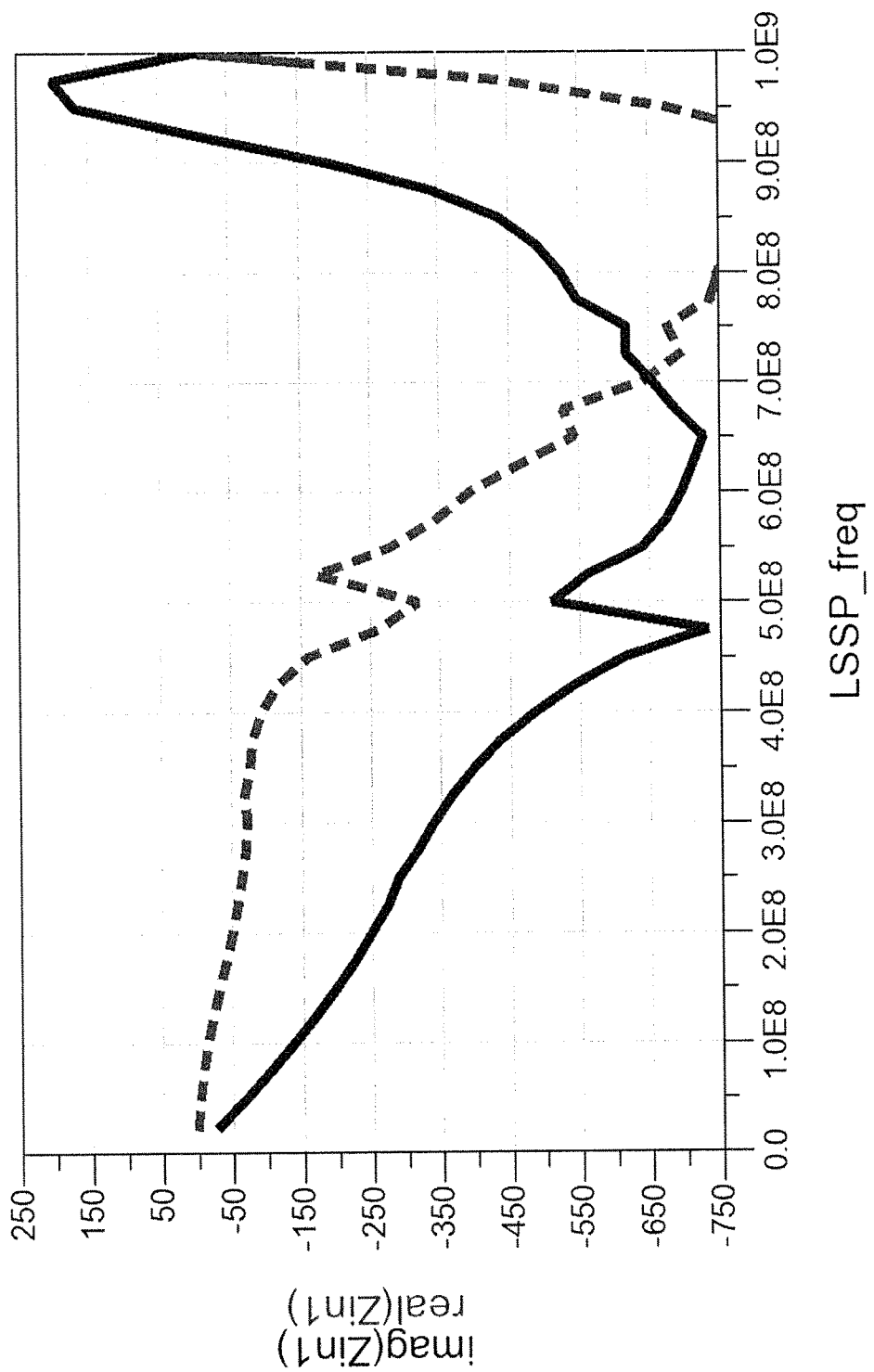
FIG. 8 shows a graph of real and imaginary port impedance for a large-signal s-parameter simulation of the circuit of FIGS. 1 and 7 according to one embodiment.

FIG. 7 illustrates an Keysight ADS simulation schematic of the configuration of FIG. 1, with delay lines, switch, and hold capacitor C1 used to simulate sampling at 1 GHz, T=1 ns, with i[n]=i[n−1]+Tv[n]/L=i[n−1]−0.004 v[n], so design value is L=−T/0.004=−250 nH. FIG. 8 illustrates an Keysight ADS large-signal s-parameter simulation of the configuration of FIG. 1 and schematic of FIG. 7, for T=1 ns and L=−250 nH. The dashed curve is real part of input impedance Z(s), and the solid curve is imaginary part of input impedance Z(s). The predicted impedance is approximately j157 ohms for −250 nH at 100 MHz, and the observed impedance is −14−j137 ohms at 100 MHz, or −217 nH in series with −14 ohms. In addition, the shape of the reactance follows the expected frequency dependence of $Im\{Z(j\omega)\}=-\omega|L|$ for a negative inductor. More details of FIGS. 7-8 are described below.

An example negative inductance implementation of the configuration of FIG. 1 is illustrated in the Keysight ADS schematic of FIG. 7. The Keysight ADS software offers large signal s-parameters for microwave impedance measurement, but does not appear to have convenient means for mixed-signal simulation; therefore, the ADCv of FIG. 1 is implemented as switch V1 and hold capacitor Oln in FIG. 7, the unit delay is simulated by 1 ns delay line TLD1, the discrete-time sum i[n]=i[n−1]+Tv[n]/L is performed by volt-age-controlled voltage source SRC3, voltage-controlled voltage source SRC6 with gain 0.004 establishes the value of T/L, and finally the DACi is implemented with voltage-controlled current source SRC4 having transconductance 1 S. SRC7 and SRC10 are unity-gain voltage buffers, and the input of delay line TLD1 corresponds to i[n] and output of TLD1 corresponds to i[n−1]. The switch V1 and hold capacitor C1 are used under control of clock oscillator SRC5 to simulate sampling at 1 GHz, and T=1 ns. From the foregoing theory for an inductance L, i[n]=i[n−1]+Tv[n]/L, and in the circuit of FIG. 3, i[n]=i[n−1]0.004 v[n], resulting a design value of L=−T/0.004=−250 nH. The Keysight ADS large-signal s-parameter simulation of the configuration of FIG. 1 and schematic of FIG. 7 is shown in FIG. 8. The dashed curve is the real part of the input impedance Z(s), and the solid curve is the imaginary part of the input impedance Z(s). The predicted impedance is approximately j157 ohms for −250 nH at 100 MHz, and the observed impedance is −14−j137 ohms at 100 MHz, or −217 nH in series with −14 ohms. In addition, the shape of the reactance follows the expected frequency dependence of $Im\{Z(j\omega)\}=-\omega|L|$ for a negative inductor. The predicted parasitic resistance is zero for this implementation, since $Z(s)=\{sT/[(1-z^{-1})H(z)]\}|_{z=exp(sT)}=\{sT/[(1-z^{-1})T/(L-z^{-1}L)]\}|_{z=exp(sT)}=sL$, and so the simulation results show a small parasitic resistance of only −14 ohms at 100 MHz in FIG. 8.

Figure 9:
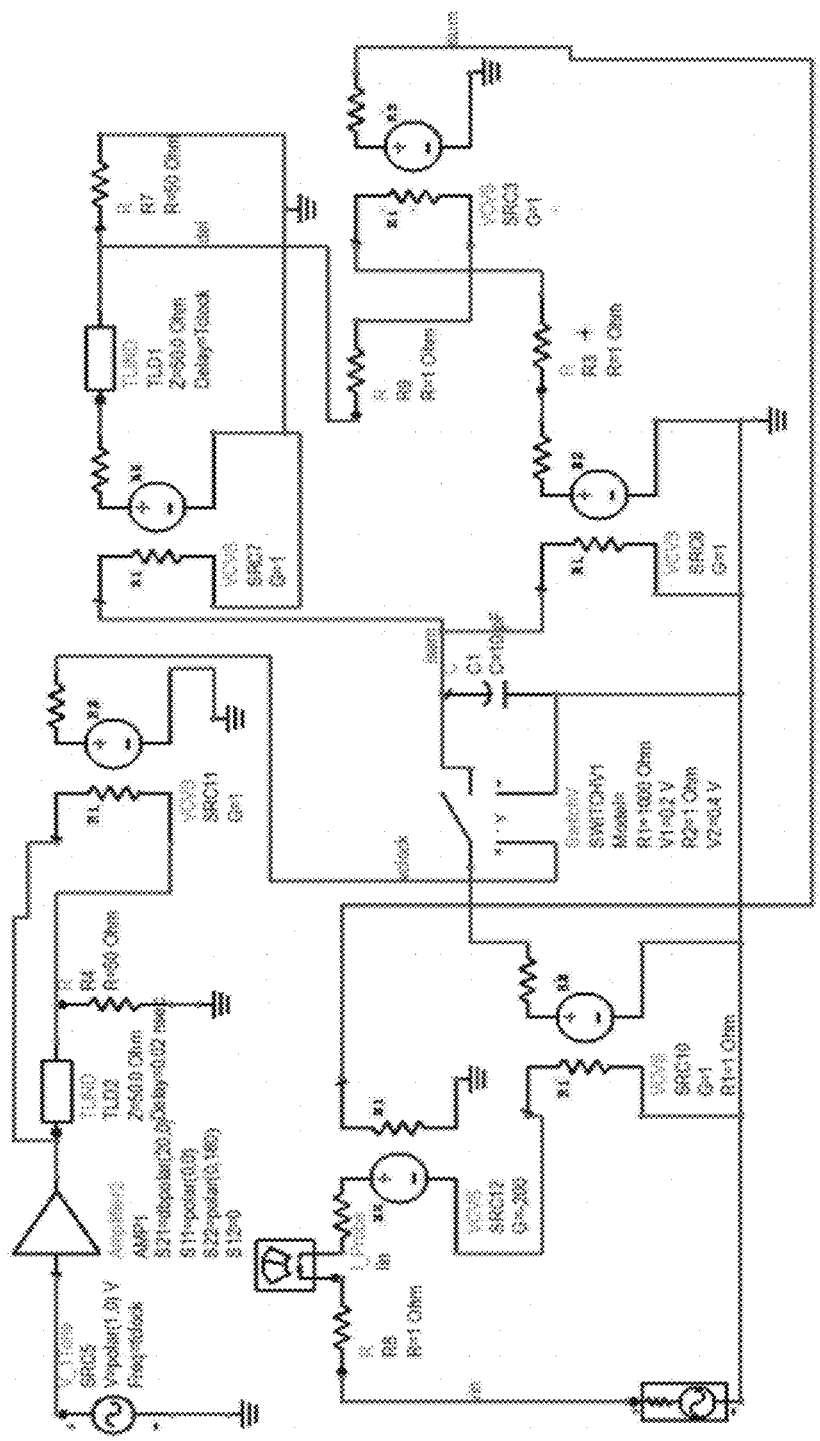
FIG. 9 shows a diagrammatic illustration of a non-Foster element according to FIG. 2 in accordance with an embodiment.
Figure 10:
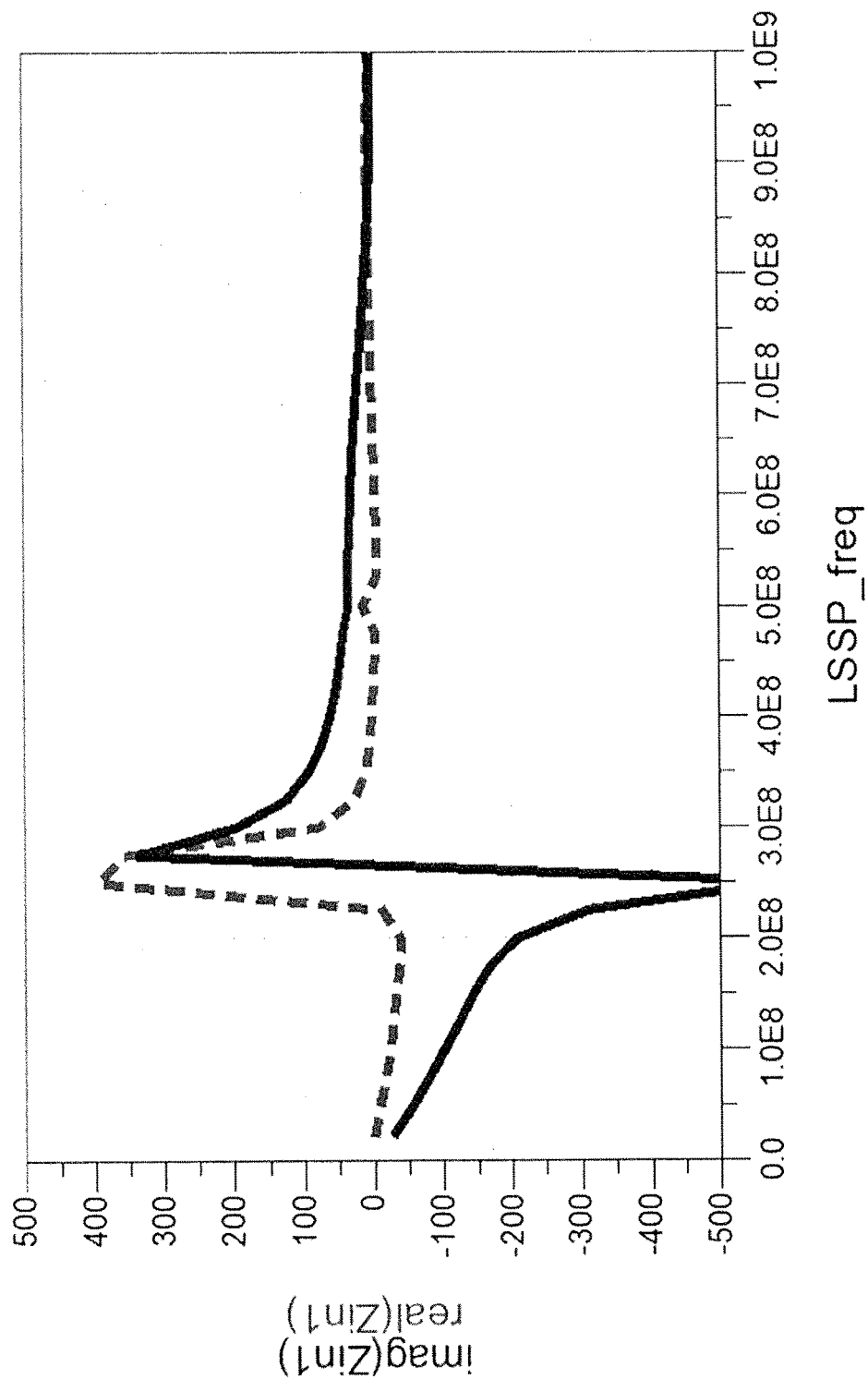
FIG. 10 shows a graph of real and imaginary port impedance for a large-signal s-parameter simulation of the circuit of FIGS. 2 and 9 according to one embodiment.

FIG. 9 illustrates an Keysight ADS simulation schematic of the configuration of FIG. 2, with delay lines, switch, and hold capacitor C1 used to simulate sampling at 1 GHz, T=1 ns, with v[n]=L(i[n]−i[n−1])/T=−200(i[n]−i[n−1]) so design value is L=−200T=−200 nH. FIG. 10 illustrates an Keysight ADS large-signal s-parameter simulation of the configuration of FIG. 1 and schematic of FIG. 9, with T=1 ns and L=−200 nH. The dashed curve is real part of input impedance Z(s), and solid blue curve is imaginary part of input impedance Z(s). The predicted impedance is approximately j126 ohms for −200 nH at 100 MHz, and the observed impedance is −24−j102 ohms at 100 MHz, or −162 nH in series with −24 ohms. In addition, the shape of the reactance follows the expected frequency dependence of $Im\{Z(j\omega)\}=-\omega|L|$ for a negative inductor. More details of FIGS. 9-10 are discussed below.

An example negative inductance implementation of the configuration of FIG. 2 is illustrated in the Keysight ADS schematic of FIG. 9. The Keysight ADS software offers large signal s-parameters for microwave impedance measurement, but does not appear to have convenient means for mixed-signal simulation; therefore, the ADCi of FIG. 2 is implemented as switch V1 and hold capacitor C1 in FIG. 9 driven by voltage-controlled voltage source SRC10 with 1 ohm input impedance and unity voltage gain (converting current i(t) into a voltage signal), the unit delay is simulated by 1 ns delay line TLD1, the discrete-time subtraction i[n]−i[n−1] is performed by voltage-controlled voltage source SRC3, and finally the DACv is implemented with voltage-controlled voltage source SRC12 having a voltage gain of −200. SRC6 and SRC7 are unity-gain voltage buffers, and the input of delay line TLD1 corresponds to i[n] and output of TLD1 corresponds to i[n−1]. The switch V1 and hold capacitor C1 are used under control of clock oscillator SRC5 to simulate sampling at 1 GHz, and T=1 ns. From the foregoing theory of FIG. 2, the circuit of FIG. 9 implements an inductance where v[n]=L(i[n]−i[n−1])/T=−200 (i[n]−i[n−1]), corresponding to a design value L=−200 T=−200 nH. FIG. 10 shows a Keysight ADS large-signals-parameter simulation of the configuration of FIG. 2 and schematic of FIG. 9, with T=1 ns and L=−200 nH. The dashed curve in FIG. 10 is the real part of the input impedance Z(s), and the solid curve is the imaginary part of the input impedance Z(s). The predicted impedance is approximately j126 ohms for −200 nH at 100 MHz, and the observed impedance is −24−j102 ohms at 100 MHz, or −162 nH in series with −24 ohms. In addition, the shape of the reactance (blue curve) in FIG. 10 follows the expected frequency dependence of $Im\{Z(j\omega)\}=-\omega|L|$ for a negative inductor. The predicted parasitic resistance follows from the relation $Z(s)\approx\{H(z)(1-z^{-1})/(sT)\}|_{z=exp(sT)}=\{L(1-z^{-1})^2/(sT^2)\}|_{z=exp(sT)}=-71-j98$, in agreement with the simulation results of of −24−j102 ohms at 100 MHz.

Figure 11:
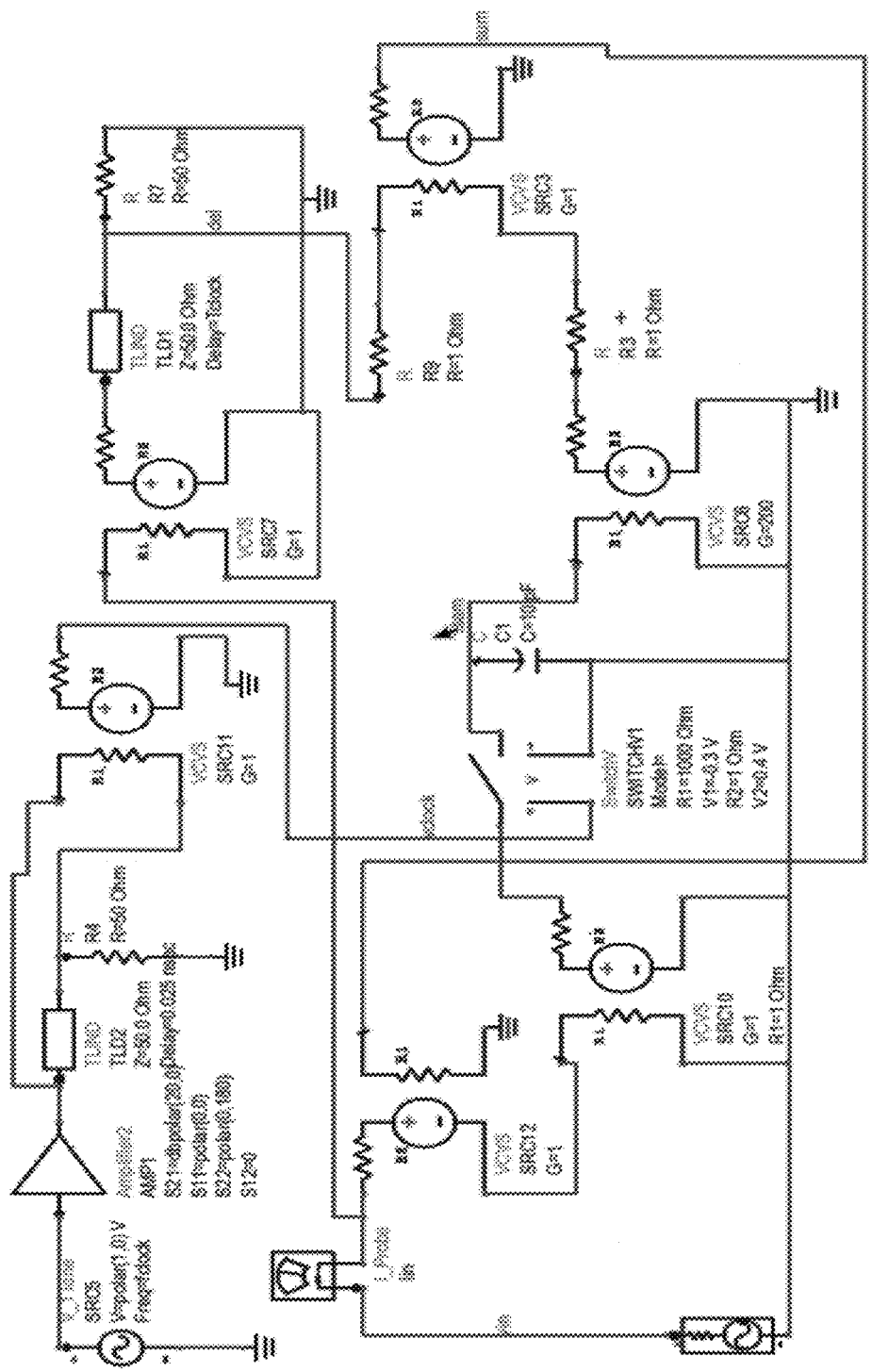
FIG. 11 shows a diagrammatic illustration and simulation of a circuit having at least one non-Foster element with the configuration of FIG. 2 according to an embodiment.

FIG. 11 shows a Keysight ADS simulation schematic of the configuration of FIG. 2, with delay lines, switch, and hold capacitor C1 used to simulate sampling at 1 GHz, T=1 ns, with v[n]=v[n−1]+Ti[n]/C=v[n−1]−200i[n], so the design value is C=−T/200=−5 pF. More details of FIG. 11 is discussed below.

Figure 12:
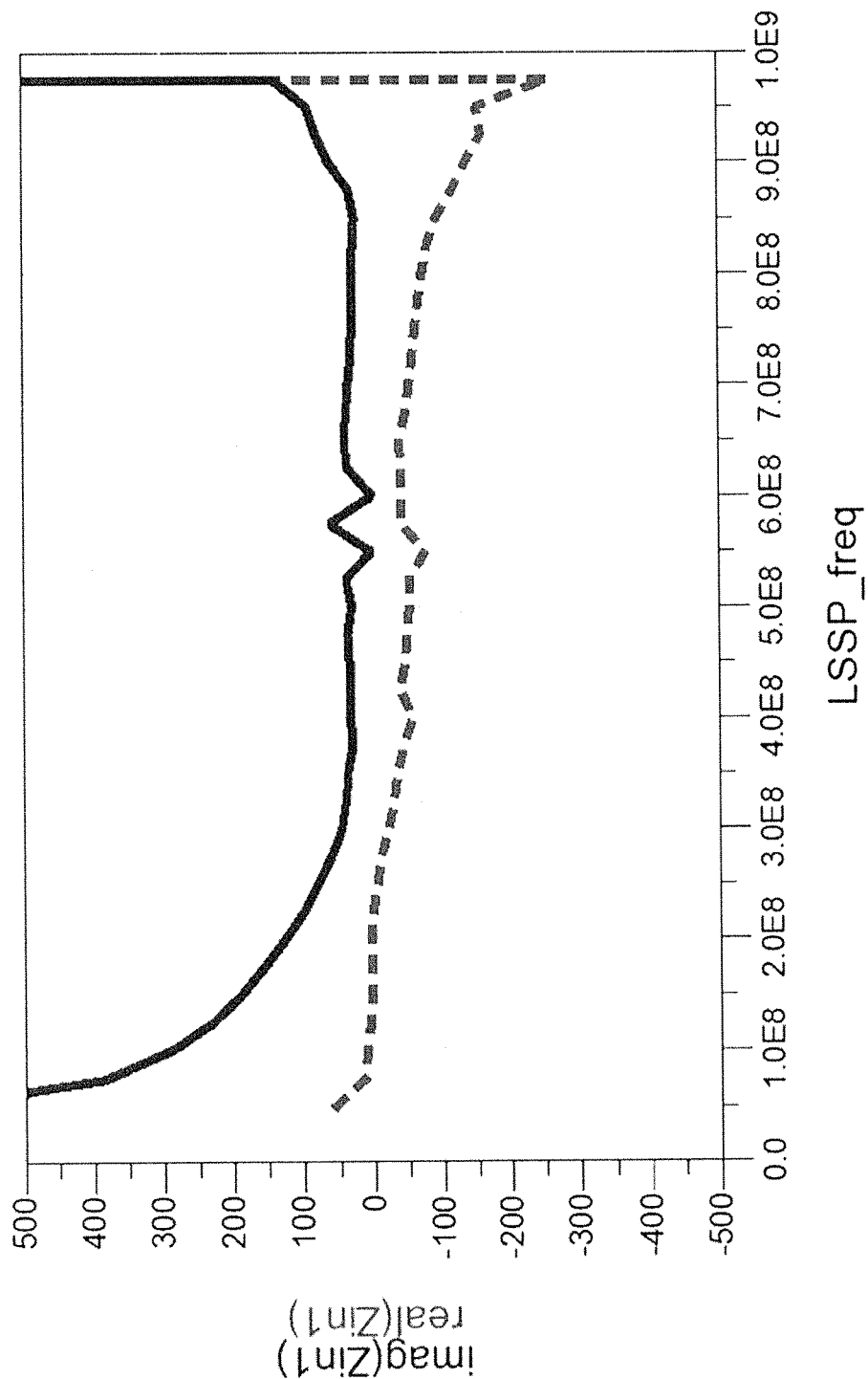
FIG. 12 shows a graph of real and imaginary port impedance for a large-signal s-parameter simulation of the circuit of FIGS. 2 and 11 according to one embodiment.
Figure 13:
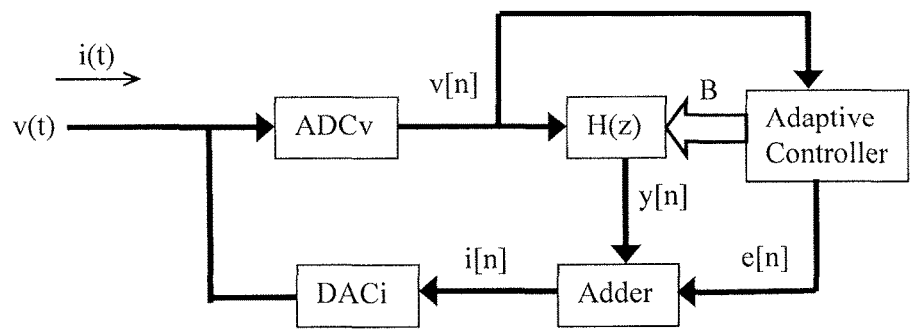
FIG. 13 shows a diagrammatic illustration of a non-Foster element with adaptive control according to an embodiment.

An example negative capacitance implementation of the configuration of FIG. 2 is illustrated in the Keysight ADS schematic of FIG. 11. The Keysight ADS software offers large signal s-parameters for microwave impedance measurement, but does not appear to have convenient means for mixed-signal simulation; therefore, the ADCi of FIG. 2 is implemented as switch V1 and hold capacitor C1 in FIG. 11 driven by voltage-controlled voltage source SRC10 with 1 ohm input impedance and unity voltage gain (converting current i(t) into a voltage signal), the unit delay is simulated by 1 ns delay line TLD1, the discrete-time addition v[n−1]+Ti[n]/C is performed by voltage-controlled voltage source SRC3, and finally the DACv is implemented with voltage-controlled voltage source SRC12 having a voltage gain of 1. SRC6 has gain 200 to establish T/C, and SRC7 is unity-gain voltage buffer, and the input of delay line TLD1 corresponds to v[n] and output of TLD1 corresponds to v[n−1]. The switch V1 and hold capacitor C1 are used under control of clock oscillator SRC5 to simulate sampling at 1 GHz, and T=1 ns, with the output of the switch representing i[n]. From the foregoing theory of FIG. 2, the circuit of FIG. 11 implements capacitance by v[n]=v[n−1]+Ti[n]/C=v[n−1]−200i[n], corresponding to a design value C=−T/200=−5 pF. FIG. 12 shows a Keysight ADS large-signal s-parameter simulation of the configuration of FIG. 2 and schematic of FIG. 11, with T=1 ns and C=−5 pF. The dashed red curve in FIG. 12 is the real part of the input impedance Z(s), and the solid blue curve is the imaginary part of the input impedance Z(s). The predicted impedance is +j318 ohms for −5 pF at 100 MHz, and the observed impedance is 9+j292 ohms at 100 MHz, or −5.5 pF in series with 9 ohms. In addition, the shape of the reactance follows the expected inverse frequency dependence of $Im\{Z(j\omega)\}=+1/(\omega|C|)$ for a negative capacitor. Predicted parasitic resistance is zero for this implementation, since $Z(s)\approx\{H(z)(1-z^{-1})/(sT)\}|_{z=exp(sT)}=\{(T/(C-z^{-1}C))(1-z^{-1})/(sT)\}|_{z=exp(sT)}=1/(sC)$, the simulation results show only 9 ohms parasitic resistance at 100 MHz from FIG. 12, FIG. 13 illustrates an embodiment with adaptive control, where continuous-time input voltage v(t) is digitized by analog-to-digital converter ADCv into discrete-time signal v[n], then processed by a discrete-time filter with z-transform H(z) to form discrete-time signal y[n], an adaptive controller with input v[n] and with output discrete-time signal e[n] and with output control bus B that controls H(z), and an adder that forms discrete-time current i[n]=y[n]+e[n] which is finally converted into continuous-time input current i(t) by digital-to-analog converter DACi. As illustrated, ADCv would have high input impedance, and DACi would have high output impedance.

It should be understood that the signal processing and discrete time approach of the present application offers significant advantages such as low cost, repeatability, scalability, and incorporation of adaptive control methods and adaptive stabilization methods. It should be understood that signal processing and discrete time approaches can be implemented in analog hardware, in delay lines, in analog signal samplers, in digital circuits, in software, or in combinations of these means. An embodiment with adaptive control is shown in FIG. 13, where continuous-time input voltage v(t) with Laplace transform V(s) is digitized by ADCv into discrete-time signal v[n], then processed by a discrete-time filter with impulse response h[n] and z-transform H(z) to form discrete-time signal y[n]=v[n]*h[n], (with * denoting convolution). An adaptive controller with input y[n] has an output discrete-time signal e[n] and has an output control bus B that controls H(z) and h[n]. An adder generates discrete-time current i[n]=y[n]+e[n], and i[n] is finally converted by DACi into continuous-time input current i(t) with Laplace transform I(s). As illustrated in FIG. 9, ADCv would have high input impedance, and DACi high output impedance. It should be understood that the embodiment of FIG. 13 is an adaptive controlled version of the embodiment of FIG. 1, and similar adaptive controlled embodiments can be created for the embodiment of FIG. 2.

It should be understood that the adaptive controller of FIG. 13 can be used to accomplish a wide variety of desirable system behaviors such as system adaptation to changing input signals, adaptation to changing external impedances, adaptation to changing temperature, and adaptive stabilization methods. Of particular interest in many non-Foster circuit applications is the use of the adaptive controller of FIG. 13 for adaptive stabilization methods to assure stability in the presence of an external load impedance $Z_e(s)$. Under these conditions, the total impedance $Z_T(S)$ at the port terminal is the parallel combination $Z_T(S)=Z_e(s)Z(s)/\{Z_e(s)+Z(s)\}$, where $Z(s)=V(s)/I(s)$. The embodiment of FIG. 13 can be used to stabilize $Z_T(s)$ in a variety of ways. In one example implementation, an initialization sequence can be used to first probe $Z_e(s)$ where the adaptive controller in FIG. 13 initially sets H(z)=0 and h[n]=0 such that y[n]=0, and then applies an impulse e[n] such that i[n]=y[n]+δ[n]=δ[n] initially. The adaptive controller then measures the voltage response v[n] to determine $Z_e(s)$, since $V^*(s)=\Sigma v(nT)e^{-nsT}\approx V(S)\approx Z_e(s)$ below the Nyquist frequency 0.5/T Hz for an impulse current at i[n]. In many non-Foster applications, a non-Foster impedance Z(s) is used to obtain some desired stable total impedance $Z_T(S)$, for example cancelling some external capacitance. In such applications where the desired stable $Z_T(S)$ is known and where $Z_e(s)$ is determined from the foregoing initialization, the necessary design impedance is $Z(s)=V(s)/I(s)=Z_e(s)Z_T(s)/(Z_e(s)-Z_T(s))$. When e[n]=0 after initialization for the configuration of FIG. 13, the desired H(z) is then established by the adaptive controller over control bus B. For example, noting that I(z)=H(z)V(z) in FIG. 13, H(s) could be determined using the bilinear transform method, $H(z)=I(z)/V(z)=Z^{-1}(s)|_{s=(2/T)(z-1)/(z+1)}=\{(Z_e(s)-Z_T(s))/(Z_e(s)Z_T(s))\}|_{s=(2/T)(z-1)/(z+1)}$. It should be understood that the design can also be modified to compensate for a zero order hold in the DACi. It should be understood that a variety of alternative methods such as least-squares, Pade methods, Prony methods, impulse invariance, and other such design methods can be used to design H(z). It is also noted that use of the autocorrelation method form of Prony filter design in implementations of the foregoing procedures results in Toeplitz form normal equations, assuring stable discrete-time designs with poles inside the unit circle. It should be understood that many other techniques may be used to establish H(z) and stability of the overall system, even in non-stationary environments, including pseudo-random training sequences, least mean squares, recursive least squares, Kalman filtering, and many other adaptive filter design methods.

As an example of the foregoing method, consider an external impedance of a positive resistance R in parallel with a positive capacitance C, such that $Z_e(s)=R/(1+sRC)$ and where a desired total impedance of $Z_T(s)=R/\{1+sR(C/10)\}$ is the design goal. This is the equivalent of reducing the external capacitance C by a factor of 0.9. The external impedance would first be determined, as described above, by setting H(z)=0 and applying an impulse $i[n]=\delta[n]$, and determining $Z_e(s)$ from the measured v[n]. The desired design impedance is then $Z(s)=V(s)/I(s)=Z_e(s)Z_T(s)/(Z_e(s)-Z_T(s))\}=-1/(0.9\ sC)$. In essence, the design results in a negative capacitor of $-0.9\ C$ to be placed in parallel with the external load of R in parallel with capacitance C. Since the result for this example is a negative capacitor, the methods of designing H(z) for negative capacitance in the previous paragraphs, and in following paragraphs, can also be used.

Figure 14:
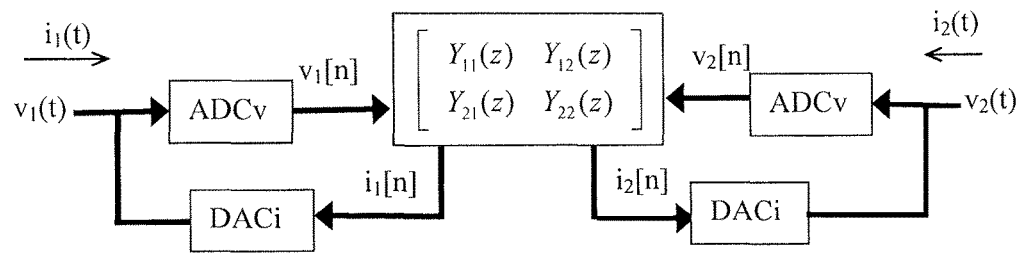
FIG. 14 shows a diagrammatic illustration of non-Foster circuit having two ports according to an embodiment.

A two-port embodiment of the present application is shown in FIG. 14. The one-port embodiments of FIG. 1, FIG. 2, and FIG. 13 are further extended to multiport designs, such as the two-port example of FIG. 14. In FIG. 14, a two-port embodiment has continuous-time input voltages $v_1(t)$ and $v_2(t)$ that are digitized by two analog-to-digital converters denoted ADCv into discrete-time signals $v_1[n]$ and $v_2[n]$, then processed by a multi-port discrete-time filter with z-transform admittance matrix Y(z) to form discrete-time currents $i_1[n]$ and $i_2[n]$, which are finally converted into continuous-time input currents $i_1(t)$ and $i_2(t)$ by two digital-to-analog converters denoted DACi. As illustrated, the two ADCv would have high input impedances, and the two DACi would have high output impedances.

In the two-port embodiment illustrated in FIG. 14, analog continuous-time input voltages $v_1(t)$ and $v_2(t)$ with Laplace transforms $V_1(s)$ and $V_2(s)$ are converted to digital discrete-time signals $v_1[n]$ and $v_2[n]$ with z-transforms $V_1(z)$ and $V_2(z)$ by a pair of analog-to-digital voltage converters (ADCv) with clock period T, processed digitally with a multi-port discrete-time filter with z-transform admittance matrix Y(z) to form discrete-time signals $i_1[n]$ and $i_2[n]$ having z-transforms $I_1(z)$ and $I_2(z)$, and finally $I_1[n]$ and $I_{2[n]}$ are converted into analog continuous-time input currents $i_1(t)$ and $i_2(t)$ having Laplace transform $I_1(s)$ and $I_2(s)$ by using two digital-to-analog current converters (DACi) with clock period T. The z-transform admittance matrix Y(z) is defined as:

$$\begin{bmatrix} I_1(z) \\ I_2(z) \end{bmatrix} = \begin{bmatrix} Y_{11}(z) & Y_{12}(z) \\ Y_{21}(z) & Y_{22}(z) \end{bmatrix} \begin{bmatrix} V_1(z) \\ V_2(z) \end{bmatrix} = Y(z) \begin{bmatrix} V_1(z) \\ V_2(z) \end{bmatrix} \quad (1)$$

where the z-transform relations are $I_1(z)=V_1(z)Y_{11}(z)+V_2(z)Y_{12}(z)$ and $I_2(z)=V_1(z)Y_{21}(z)+V_2(z)Y_{22}(z)$, with corresponding convolution relations $i_1[n]=v_1[n]*y_{11}[n]+v_2[n]*y_{12}[n]$ and $i_2[n]=v_1[n]*y_{21}[n]+v_2[n]*y_{22}[n]$ (with * denoting convolution). For this embodiment, $I_1(s)=V_1^*(s)\{Y_{11}(z)(1-z^{-1})/s\}|_{z=exp(sT)}+V_2^*(s)\{Y_{12}(z)(1-z^{-1})/s\}|_{z=exp(sT)}$ And $I_2(s)=V_1^*(s)\{Y_{21}(z)(1-z^{-1})/s\}|_{z=exp(sT)}+V_2^*(s)\{Y_{22}(z)(1-z^{-1})/s\}|_{z=exp(sT)}$ And so, $$\begin{bmatrix} I_1(s) \\ I_2(s) \end{bmatrix} = \begin{bmatrix} Y_{11}(z)(1-z^{-1})/s|_{z=exp(sT)} & Y_{12}(z)(1-z^{-1})/s|_{z=exp(sT)} \\ Y_{21}(z)(1-z^{-1})/s|_{z=exp(sT)} & Y_{22}(z)(1-z^{-1})/s|_{z=exp(sT)} \end{bmatrix} \begin{bmatrix} V_1^*(s) \\ V_2^*(s) \end{bmatrix} \quad (2)$$

where $V^*(s)=\Sigma v(nT)e^{-nsT}$ for integer n, and assuming a zero-order hold (ZOH) incorporated into the DACi.

To illustrate the embodiment of FIG. 14, consider the example of implementing a two-port circuit that simply consists of capacitor connected between the two ports, with capacitance C. In this example the Laplace admittance matrix Y(s) and equations for the analog circuit are:

$$\begin{bmatrix} I_1(s) \\ I_2(s) \end{bmatrix} = \begin{bmatrix} sC & -sC \\ -sC & sC \end{bmatrix} \begin{bmatrix} V_1(s) \\ V_2(s) \end{bmatrix} = Y(s) \begin{bmatrix} V_1(s) \\ V_2(s) \end{bmatrix} \quad (3)$$

For this example of a capacitor connected between the two ports, the currents are $i_1(t)=-i_2(t)=Cd(v_1(t)-v_2(t))/dt$, and a positive or negative capacitor may be approximated in the embodiment of FIG. 14 by using the discrete-time backward-difference approximation of the derivative $i_1[n]=-i_2[n]=C(v_1[n]-v_2[n]-v_1[n-1]+v_2[n-1])/T$, or equivalently setting $I_1(z)=-I_2(z)=CV_1(z)(1-z^{-1})/T-CV_2(z)(1-z^{-1})/T$.

Thus, the two-port admittance matrix Y(z) and relations become:

$$\begin{bmatrix} I_1(z) \\ I_2(z) \end{bmatrix} = \begin{bmatrix} \frac{C}{T}(1-z^{-1}) & -\frac{C}{T}(1-z^{-1}) \\ -\frac{C}{T}(1-z^{-1}) & \frac{C}{T}(1-z^{-1}) \end{bmatrix} \begin{bmatrix} V_1(z) \\ V_1(z) \end{bmatrix} = Y(z) \begin{bmatrix} V_1(z) \\ V_2(z) \end{bmatrix} \quad (4)$$

As illustrated in FIG. 14 and the foregoing example, preferentially the two ADCv would have high input impedances and the two DACi would have high output impedance, for simplicity in exposition, such that the current into the two ADCv would be approximately zero and the port currents approximately equal to the DACi output currents. Alternatively, the positive or negative capacitor may be approximated by using the bilinear transform approximation on the matrix Y(s) in (3), replacing s by $2(z-1)/\{(z+1)T\}$ yielding:

$$\begin{bmatrix} I_1(z) \\ I_2(z) \end{bmatrix} = \begin{bmatrix} \frac{2C(z-1)}{T(z+1)} & -\frac{2C(z-1)}{T(z+1)} \\ -\frac{2C(z-1)}{T(z+1)} & \frac{2C(z-1)}{T(z+1)} \end{bmatrix} \begin{bmatrix} V_1(z) \\ V_2(z) \end{bmatrix} \quad (5)$$

Figure 15:
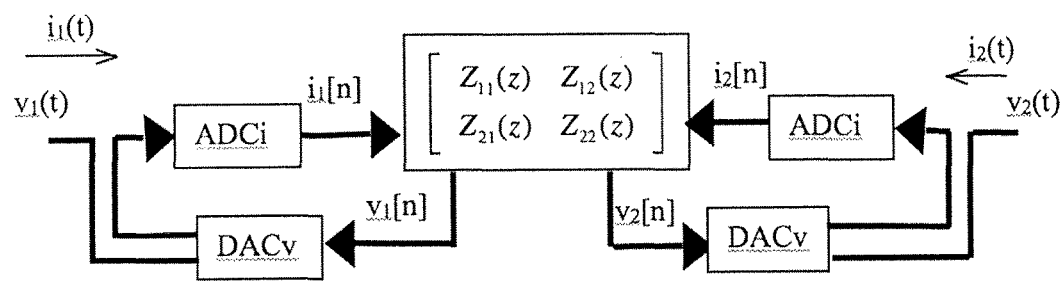
FIG. 15 shows a diagrammatic illustration of non-Foster circuit having two ports according to another embodiment.

It should be understood that any general Foster or non-Foster two-port with admittance matrix Y(s) may be approximated by appropriate selection of discrete-time signal processing system characterized by two-port z-transform admittance matric Y(z), where such discrete-time signal processing may be accomplished in hardware, software, or combination of hardware and software. It should be understood that the foregoing one and two-port embodiments of Foster or non-Foster circuits can be extended to any number of ports. It should be understood that the designer may further compensate for desired Foster and non-Foster two-port characteristics as a function of frequency by proper design of admittance matrix Y(z) using a variety of methods such as least-squares, Pade methods, Prony methods, bilinear transform, impulse invariance, and other such design methods for H(z). It should be understood that admittance matrices may be converted to and from other types of matrices such as impedance matrices, ABCD matrices, and other forms as may be useful for a particular application or design. It should be understood that the embodiment of FIG. 2 when adapted to the two-port embodiment of FIG. 14 would result more naturally in a z-transform impedance matrix Z(z), as illustrated in FIG. 15. The z-transform impedance matrix Z(z) is defined as:

$$\begin{bmatrix} V_1(z) \\ V_2(z) \end{bmatrix} = \begin{bmatrix} Z_{11}(z) & Z_{12}(z) \\ Z_{21}(z) & Z_{22}(z) \end{bmatrix} \begin{bmatrix} I_1(z) \\ I_2(z) \end{bmatrix} = Z(z) \begin{bmatrix} I_1(z) \\ I_2(z) \end{bmatrix} \quad (6)$$

It is noted that FIG. 15 illustrates a second two-port embodiment where continuous-time input currents $i_1(t)$ and $i_2(t)$ are digitized by two ADCi into discrete-time signals $i_1[n]$ and $i_2[n]$, then processed by a multi-port discrete-time filter with z-transform impedance matrix Z(z) to form discrete-time signals $v_1[n]$ and $v_2[n]$, which are finally converted into continuous-time output voltages $v_1(t)$ and $v_2(t)$ by two DACv. As illustrated, ADCi would have low input impedance, and DACv low differential output impedance, and i[n]=i(nT) for integer n and clock period T.

Figure 16:
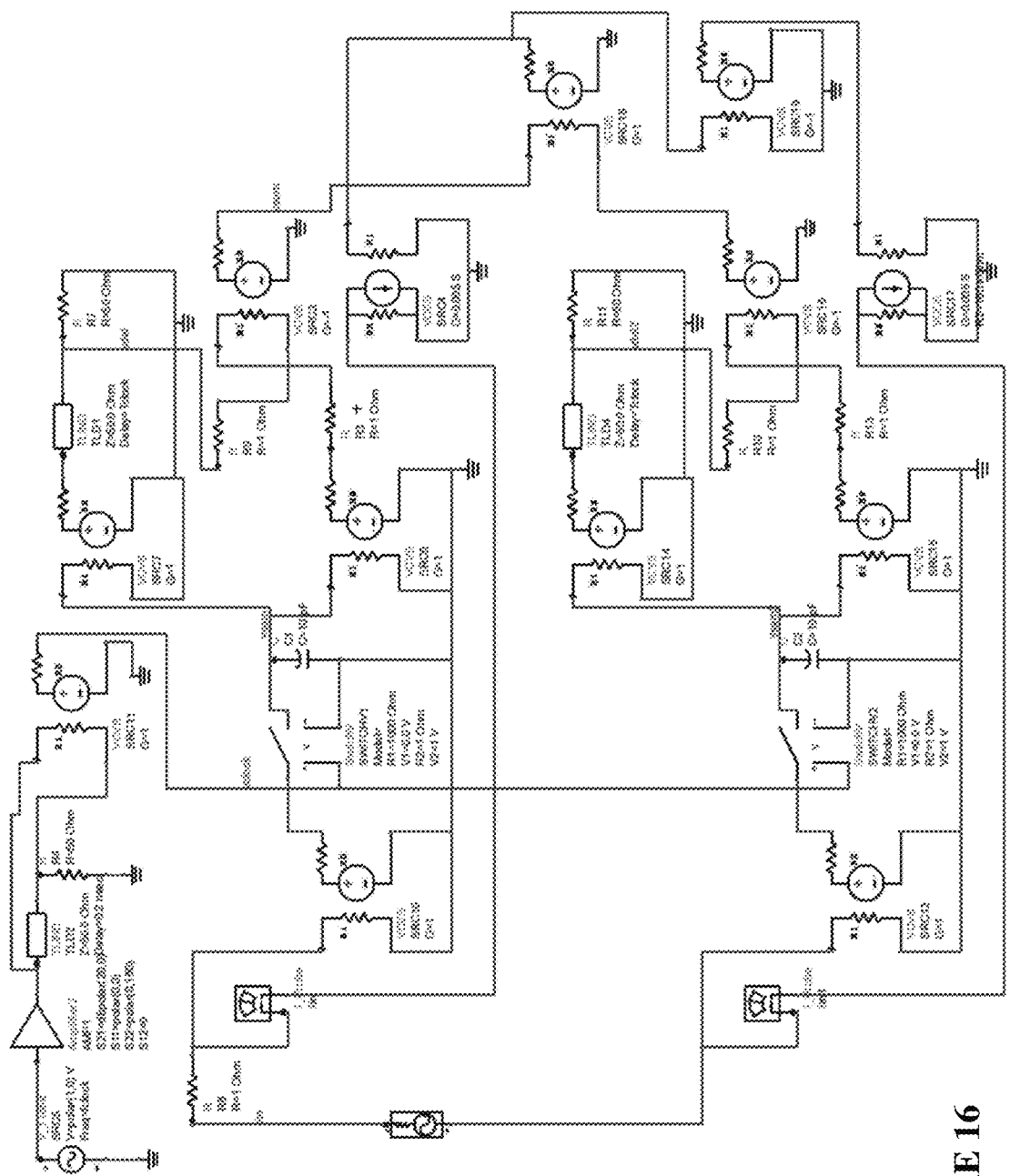
FIG. 16 shows a diagrammatic illustration and simulation of a circuit having at least one non-Foster element with the configuration of FIG. 14 according to an embodiment.

FIG. 16 illustrates an Keysight ADS simulation schematic an implementation of the two-port configuration of FIG. 14, designed to implement a capacitance between the two ports, with sampling at 1 GHz, T=1 ns, with $i_1[n]=-i_2[n]=C(v_1[n]-v_2[n]-v_1[n-1]+v_2[n-1])/T=-0.005$ $(v_1[n]-v_2[n]-v_1[n-1]+v_2[n-1])$, so design value is C=0.005T=−5 pF. The implementation is based on the one-port design of FIG. 3, replicated to support two ports and share a common clock. More information on FIG. 16 is discussed below.

An example negative capacitance implementation of the configuration of FIG. 14 is illustrated in the Keysight ADS schematic of FIG. 16. The Keysight ADS software offers large signal s-parameters for microwave impedance measurement, but does not appear to have convenient means for mixed-signal simulation; therefore, the two ADCv of FIG. 14 are implemented as switches V1 and V2 and hold capacitors C1 and C2 in FIG. 16, the unit delay is simulated by 1 ns delay lines TLD1 and TLD4, the discrete-time subtraction $v_1[n]-v_2[n]-v_1[n-1]+v_2[n-1]$ is performed by voltage-controlled voltage sources SRC3, SCR16, and SRC18, and finally the two DACi are implemented with voltage-controlled current sources SRC4 and SRC17 having transconductance 0.005 S. SRC19 drives SRC17 out of phase to accomplish the relationship $i_1[n]=-i_2[n]$ in the design equation $i_1[n]=-i_2[n]=C(v_1[n]-v_2[n]-v_1[n-1]+v_2[n-1])/T$. SRC6, SRC7, SRC10, SRC13, SRC14, and SRC15 are unity-gain voltage buffers, and the inputs of delay lines TLD1 and TLD4 correspond to $v_1[n]$ and $v_2[n]$ and outputs correspond to $v_1[n-1]$ and $v_2[n-1]$. The switches V1 and V2 and hold capacitors C1 and C2 are used under control of clock oscillator SRC5 to simulate sampling at 1 GHz, and T=1 ns. The two ports of FIG. 14 correspond to the two terminals of the floating differential input denoted P_1Tone PORT1 in the FIG. 16 schematic, and corresponds to a differential excitation across the two ports. From the foregoing theory for a two-port network equivalent to a capacitance C connected between the ports, $i_1[n]=-i_2[n]=C(v_1[n]-v_2[n]-v_1[n-1]+v_2[n-1])/T$, and in the circuit of FIG. 16, $i_1[n]=-i_2[n]=-0.005$ $(v_1[n]-v_2[n]-v_1[n-1]+v_2[n-1])$, resulting a design value of C=−0.005T=−5 pF.

Figure 17:
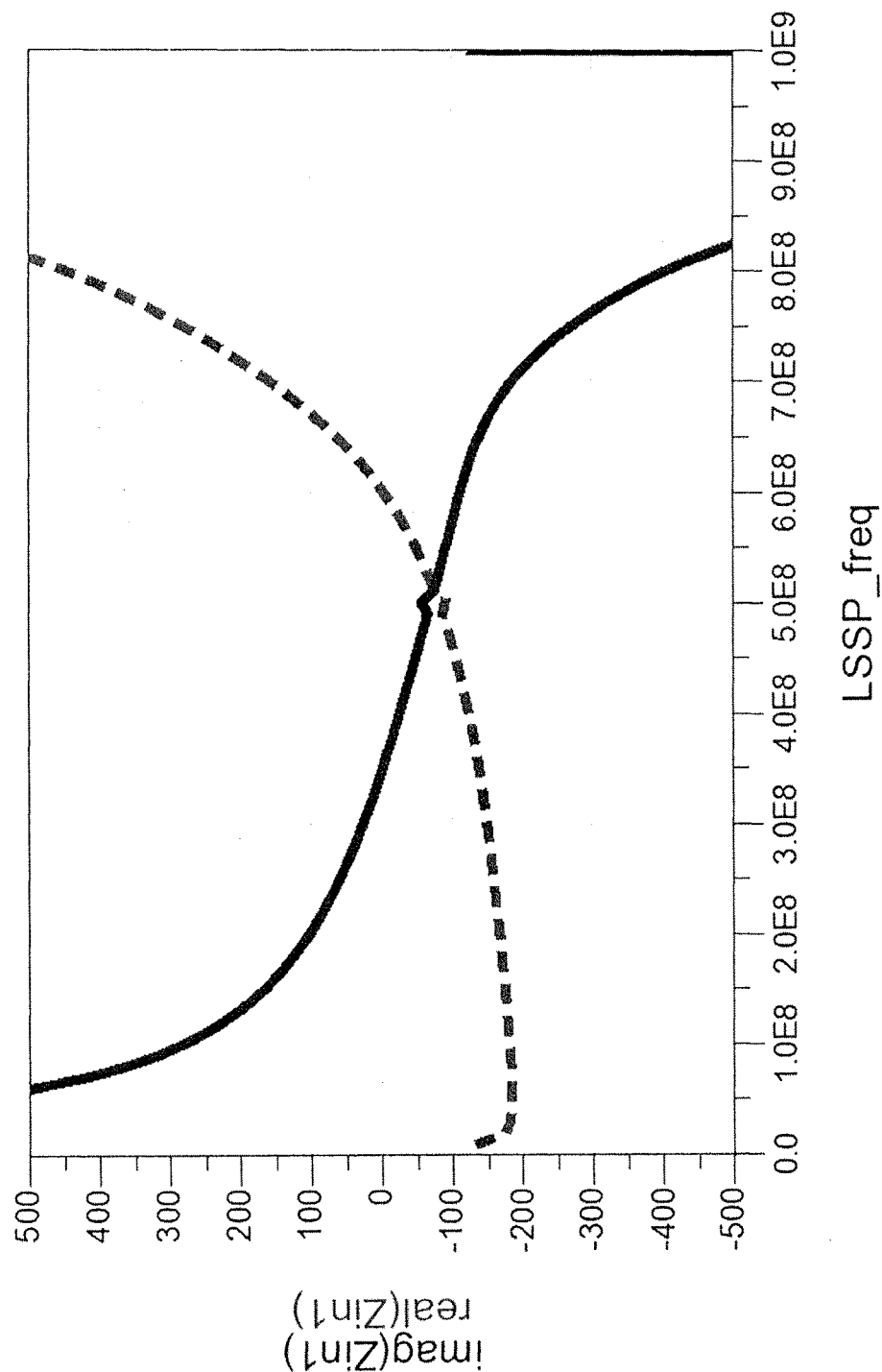
FIG. 17 shows a graph of real and imaginary port impedance for a large-signal s-parameter simulation of the circuit of FIG. 14 according to one embodiment.

FIG. 17 shows a Keysight ADS large-signal s-parameter simulation of the configuration of FIG. 14 and schematic of FIG. 16, with T=1 ns and C=−5 pF. The dashed curve is the real part of the differential input impedance between the two ports, and the solid curve is the imaginary part of the input impedance. The predicted impedance is approximately +j318 ohms for −5 pF at 100 MHz, and the observed impedance of −181 30 j283 ohms at 100 MHz corresponds to 5.6 pF in series with −181 ohms. The predicted value of parasitic resistance can be calculated from the relation $Z(s)=\{sT/[(1-z^{-1})H(z)]\}|_{z=exp(sT)}=\{sT/[(1-z^{-1})C(1-z^{-1})/T]\}|_{z=exp(sT)}=-193+j266$, and is in good agreement with the simulation results of of −181+j283 ohms at 100 MHz. In addition, the shape of the reactance (solid blue curve) in FIG. 17 follows the expected inverse frequency dependence of Im{Z(jω)}=+1/(ω|C|) for a negative capacitor.

In the foregoing two-port and multi-port embodiments, it is also noted that use of the autocorrelation method form of Prony filter design in implementations of the foregoing procedures results in Toeplitz form normal equations, assuring stable discrete-time filter designs with poles inside the unit circle. It should be understood that many other techniques may be used to establish z-transform admittance matrices Y(z) and z-transform impedance matrices Z(z) and establish stability of the overall system, even in non-stationary environments, including pseudo-random training sequences, least mean squares, recursive least squares, Kalman filtering, and many other adaptive filter design methods.

The invention is also of general use in electronic circuits, and in particular digital discrete-time implementation of Foster and non-Foster circuits. Non-Foster circuits are of particular interest in electromagnetics, metamaterials, and antenna applications. Such non-Foster circuits are useful to increase bandwidth of systems and to perform functions not possible in naturally occurring circuits and devices such as conventional capacitors, inductors, dielectrics, antennas, and ferrites.

Figure 18:
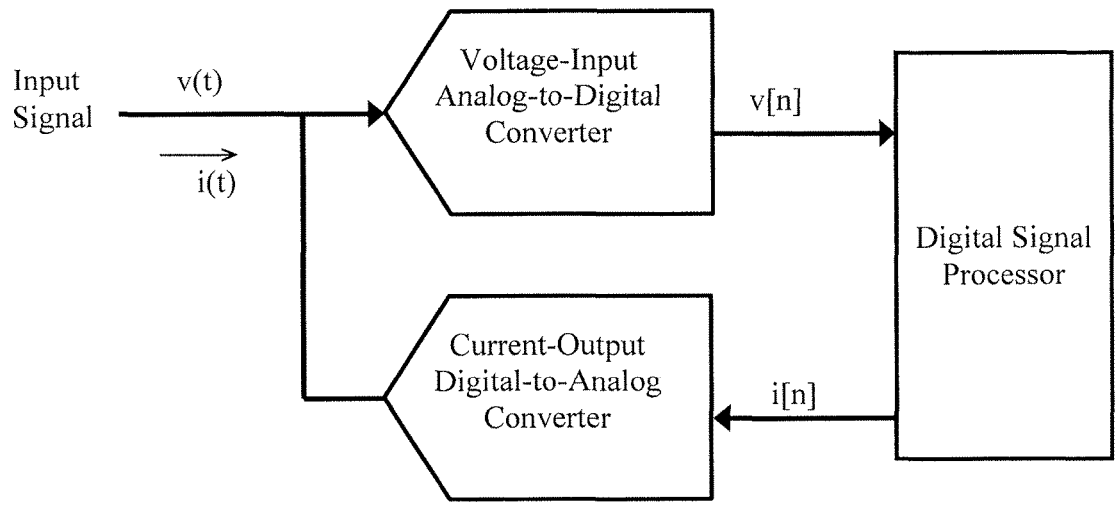
FIG. 18 shows a diagrammatic illustration of a non-Foster element according to another embodiment.
Figure 19:
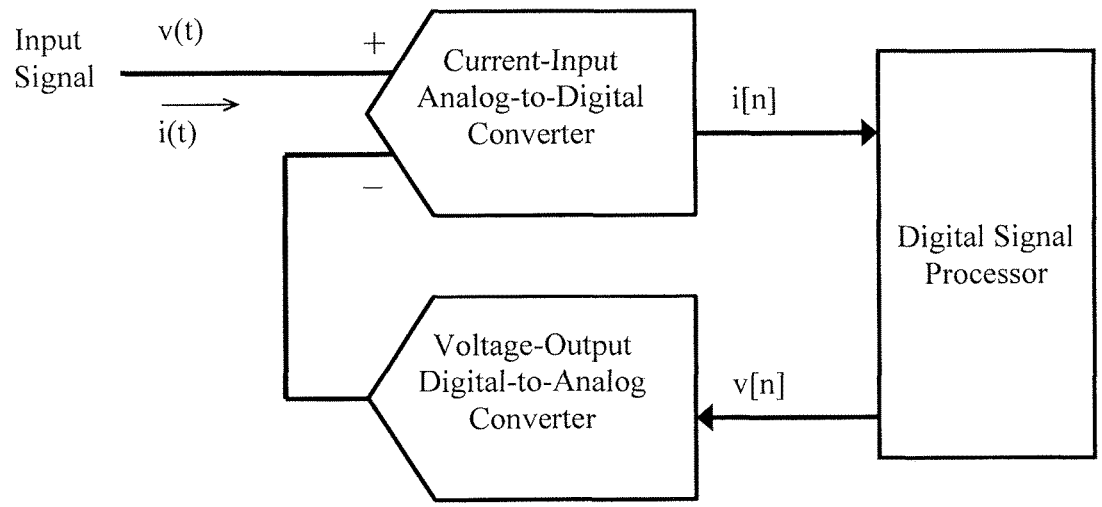
FIG. 19 shows a diagrammatic illustration of a non-Foster element according to another embodiment.

FIGS. 18-19 provide an overview of digital non-Foster circuits and elements thereof according some embodiments of the present application.

FIG. 18 illustrates a single-port embodiment of the arrangement of FIG. 1, where continuous-time input voltage v(t) at one port is digitized by the Voltage-Input Analog-to-Digital Converter into discrete-time signal v[n], then processed by a Digital Signal Processor (DSP) to form discrete-time signal i[n], which is finally converted into continuous-time input current i(t) by the Current-Output Digital-to-Analog Converter. As illustrated, the Voltage-Input Analog-to-Digital Converter (ADCv) would have high input impedance, and the Current-Output Digital-to-Analog Converter (DACi) would have high output impedance, and v[n]=v(nT) and i(nT)=i[n] for integer n and clock period T. The ADCv receives the continuous-time input signal, voltage signal v(t), from the circuit port. A discrete-time input signal v[n] is then outputted by the ADCv.

The DSP then receives the discrete-time input signal v[n] and outputs a discrete-time output signal i[n]. In a typical embodiment of FIG. 18, the Digital Signal Processor would implement a discrete-time filter having impulse response h[n] with z-transform H(z), where i[n]=v[n]*h[n] (with * denoting convolution), and with corresponding difference equation representations such as i[n]=C(v[n]−v[n−1])/T for a positive or negative capacitance C. It should be understood that the present invention should not be limited by any particular elements in the DSP as long as the discrete-time input signal v[n] is received and converted into a discrete-time output signal i[n] (e.g., v[n]→i[n] as shown in FIG. 18, or alternatively i[n]→v[n] as shown in FIG. 19).

The DACi then receives the discrete-time output signal i[n], coverts such digital signal i[n] to an analog continuous-time output signal current, current signal i(t), and outputs the desired current i(t) to the same port as continuous-time input signal v(t). In one embodiment, the node at the input of the ADCv is the same node as the output of the DACi. In another embodiment with two or more ports, every one of the ports is connected to the input of an ADCv and to the output of a DACi as illustrated for the single port in the embodiment of FIG. 18. As illustrated in FIG. 18, preferentially the ADCv would have high input impedance and the DACi would have high output impedance, for simplicity in exposition, such that the current into the ADCv would be approximately zero and the port current would approximately equal the DACi output current.

FIG. 19 shows an alternate embodiment to FIG. 18 and illustrates a single-port embodiment of the arrangement of FIG. 2. Indeed, continuous-time input signal, input current i(t), is received from the single port and digitized by the Current-Input Analog-to-Digital Converter (ADCi) into discrete-time input signal i[n]. Then, the outputted discrete-time input signal i[n] is received by and processed by a Digital Signal Processor to output a discrete-time output signal v[n]. The outputted discrete-time output signal v[n] is received by and converted into continuous-time output signal voltage, voltage v(t), by the Voltage-Output Digital-to-Analog Converter (DACv), which provides the desired voltage v(t) back to the, where the voltage drop across the ADCi is preferentially negligible for a preferentially low impedance ADCi and low impedance DACv.

As illustrated in FIG. 19, the Current-Input Analog-to-Digital Converter would have low input impedance, and the Voltage-Output Digital-to-Analog Converter would have low output impedance, the voltage drop across the ADCi is preferentially negligible, and v(nT)=v[n] and i[n]=i(nT) for integer n and clock period T.

In a typical embodiment of FIG. 19, the Digital Signal Processor would implement a discrete-time filter having impulse response h[n] with z-transform H(z), where v[n]=i[n]*h[n] (with * denoting convolution), and with corresponding difference equation representations such as v[n]=L(i[n]−i[n−1])/T for a positive or negative inductance L.

Figure 20:
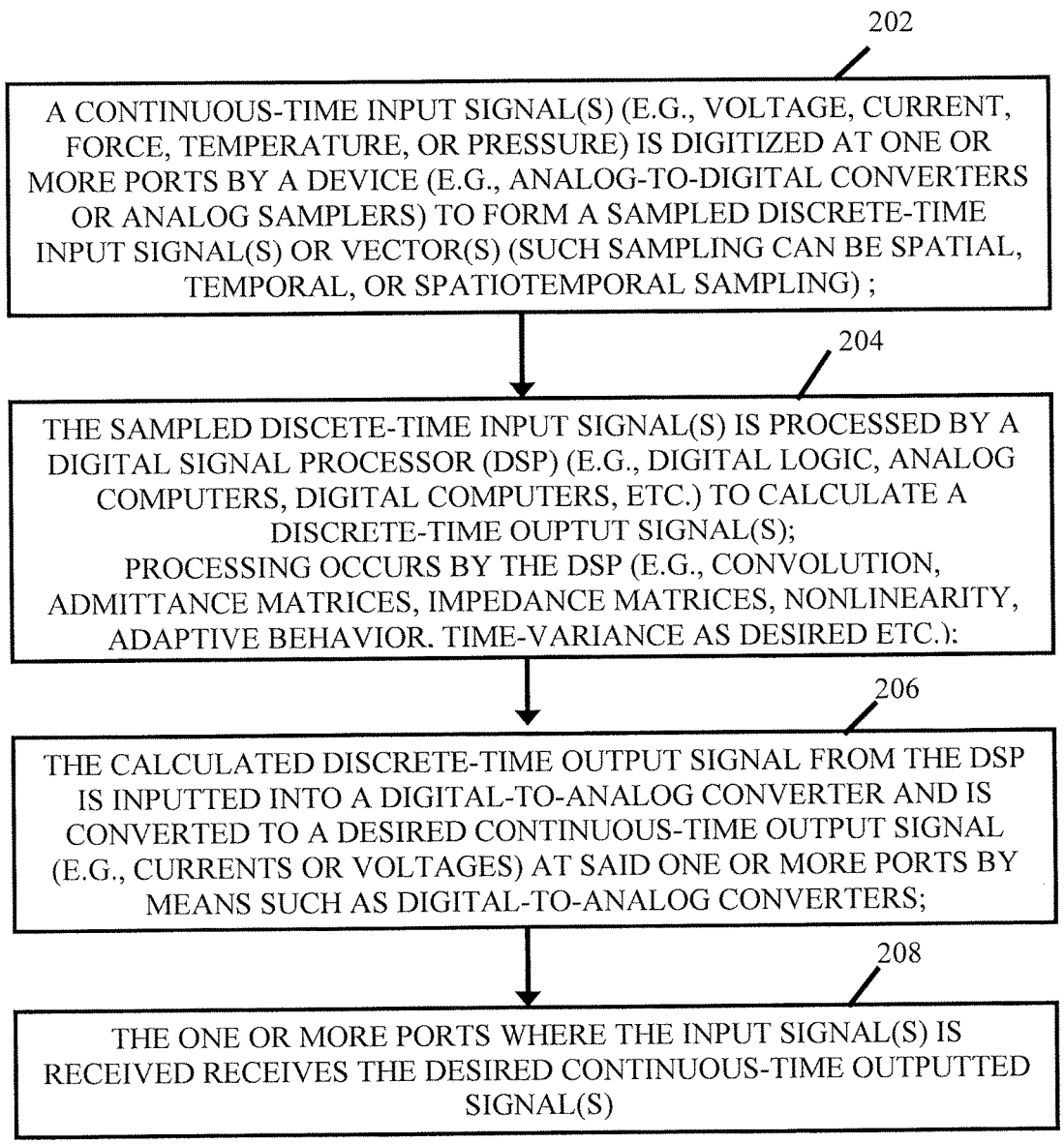
FIG. 20 illustrates a flowchart of a method of operation of a non-Foster circuit according to an embodiment.

FIG. 20 illustrates a broad or generic flow chart illustrating an embodiment of the present application. In step 202, an observed continuous-time input voltage v(t) from one or more ports of a circuit are digitized at an input signal port by means of a voltage-input analog-to-digital converter to form a sampled discrete-time input signal v[n] where v[n]=v(nT) for sampling period T, and where the analog-to-digital converter may have a high impedance.

In step 204, the sampled discrete-time input signal, or vector, or multiplicity of signals is processed (by means such as digital signal processors, digital logic, analog computers, or digital computers) to calculate a desired discrete-time output signal.

It should be understood that the processing is to include functionality such as convolution, admittance matrices, impedance matrices, nonlinearity, adaptive behavior, and time-variance as desired;

In step 206, the discrete-time output signal of the DSP, for example, is then converted by a digital-to-analog converter which outputs a desired continuous-time output signal current to the one or more ports, such as desired port currents for given port voltages, or desired port voltages for given port currents.

In step 208, the one or more ports receives the desired continuous-time outputted signal of the digital-to-analog converter while also providing the continuous-time input to the analog-to-digital converter.

Figure 21:
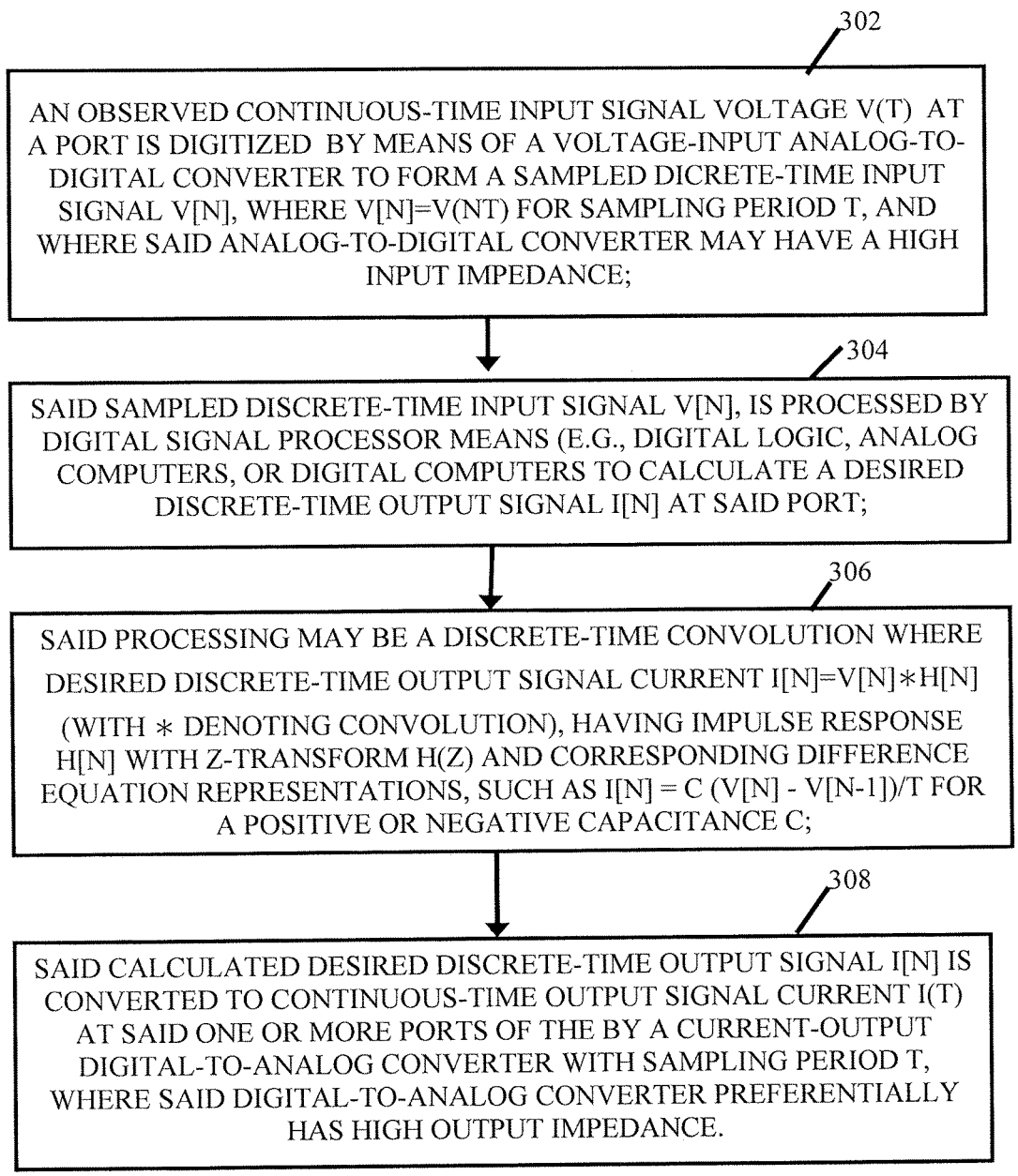
FIG. 21 illustrates a flowchart of a method of operation of a non-Foster circuit of FIG. 1 according to another embodiment.

FIG. 21 is a flow chart corresponding to FIG. 1, according to one embodiment. In step 302, an observed continuous-time input signal voltage v(t) is digitized at a port by means of a voltage-input analog-to-digital converter to form a sampled discrete-time input signal v[n], where v[n]=v(nT) for sampling period T, and where said analog-to-digital converter preferentially has high input impedance.

In step 304, the sampled discrete-time input signal v[n], is processed by means such as digital signal processors, digital logic, analog computers, or digital computers to calculate a desired discrete-time output signal i[n] at said port.

In step 306, the processing to be a discrete-time convolution where desired discrete-time output signal i[n]=v[n]*h[n] (with * denoting convolution), having impulse response h[n] with z-transform H(z) and corresponding difference equation representations, such as i[n]=C(v[n]−v[n−1])/T for a positive or negative capacitance C.

In step 308, the calculated desired discrete-time output signal v[n] is to be converted to continuous-time output signal current i(t) at said port by means of a current-output digital-to-analog converter with sampling period T, where said digital-to-analog converter preferentially has high output impedance.

Figure 22:
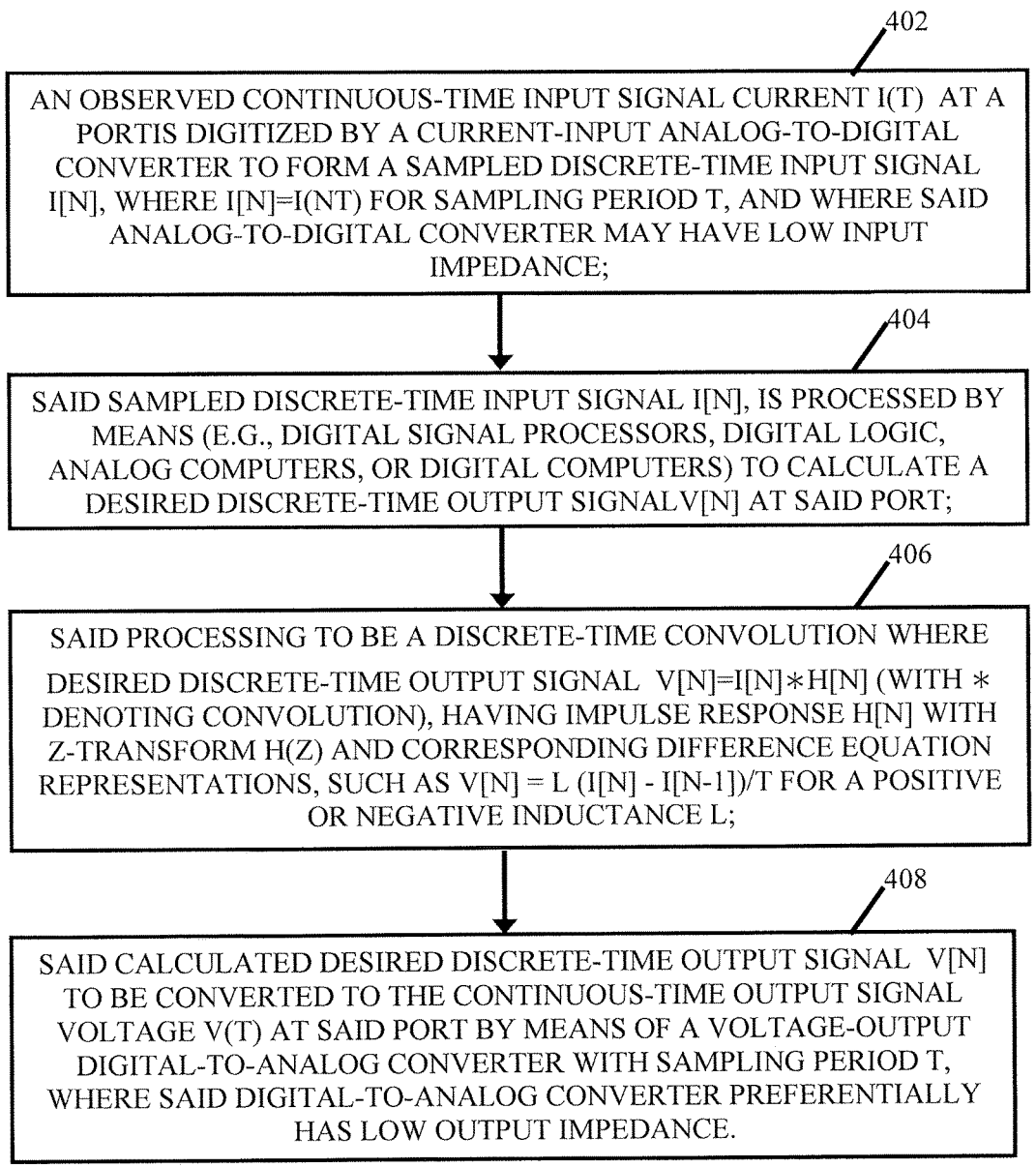
FIG. 22 illustrates a flowchart of a method of operation of a non-Foster circuit of FIG. 2 according to another embodiment.

FIG. 22 illustrates a flow chart corresponding to FIG. 2, according to one embodiment. In step 402, an observed continuous-time input signal current i(t) is digitized at a port by means of a current-input analog-to-digital converter to form a sampled discrete-time input signal i[n], where i[n]=i(nT) for sampling period T, and where said analog-to-digital converter preferentially has low input impedance.

In step 404, the sampled discrete-time input signal i[n], is processed by means such as digital signal processors, digital logic, analog computers, or digital computers to calculate a desired discrete-time output signal v[n] at said port.

In step 406, the processing to be a discrete-time convolution where desired discrete-time output signal v[n]=i[n]*h[n] (with * denoting convolution), having impulse response h[n] with z-transform H(z) and corresponding difference equation representations, such as v[n]=L(i[n]−i[n−1])/T for a positive or negative inductance L.

In step 408, the calculated desired discrete-time output signal v[n] to be converted to the continuous-time output signal voltage v(t) at said port by means of a voltage-output digital-to-analog converter with sampling period T, where said digital-to-analog converter preferentially has low output impedance.

Figure 23:
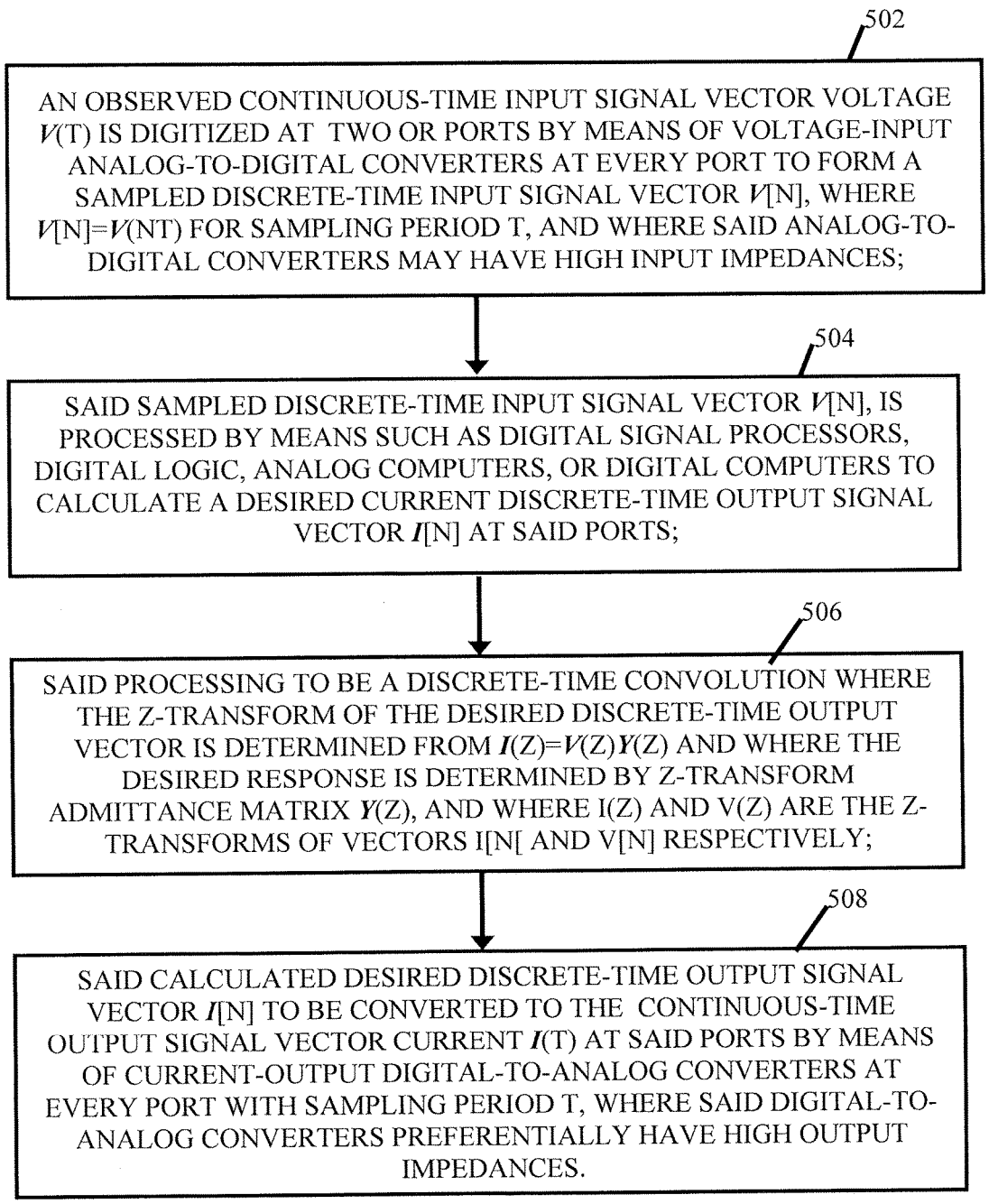
FIG. 23 illustrates a flowchart of a method of operation of a non-Foster circuit of FIG. 14 according to another embodiment.

FIG. 23 illustrates a flow chart corresponding to FIG. 14, according to another embodiment. In step 502, an observed continuous-time input signal vector voltage v(t) is digitized at two or more ports by means of voltage-input analog-to-digital converters at every port to form a sampled discrete-time input signal vector v[n], where v[n]=v(nT) for sampling period T, and where said analog-to-digital converters preferentially have high input impedances.

In step 504, the sampled discrete-time input signal vector v[n], is processed by means such as digital signal processors, digital logic, analog computers, or digital computers to calculate a desired discrete-time output signal vector i[n] at said ports.

In step 506, the processing may be a discrete-time convolution where the z-transform of the desired discrete-time output vector is determined from I(z)=V(z)Y(z) and where the desired response is determined by z-transform admittance matrix Y(z), with I(z) being the z-transform of discrete-time output vector i[n], and with V(z) being the z-transform of discrete-time input vector v[n].

In step 508, the calculated desired discrete-time output signal vector i[n] may be converted to the continuous-time output signal vector current i(t) at said ports by means of current-output digital-to-analog converters at every port with sampling period T, where said digital-to-analog converters preferentially have high output impedances.

The following are some embodiments of the present application:

A1. A method to implement circuits and circuit elements having one or more ports, comprising: digitizing, using an analog-to-digital converter, a signal at one or more ports of a component; processing the signal to calculate a desired current or voltage at the one or more ports; processing to include functionality comprising at least one of convolution, difference equations, admittance matrices, impedance matrices, nonlinearity, adaptive, and time-variance; and converting, using a digital-to-analog converter, the calculated desired current or voltage to output signal at one or more ports.

The method of claim A1, for non-Foster circuits and non-Foster elements.

The method of claim A2 where: said digitizing consists of digitizing the voltage at the port of a component having only one port; said processing consists of calculating the desired current at said port; said processing to include functionality comprising convolution or difference equations; and converting, using a digital-to-analog converter, the calculated desired current to output signal at said port.

The method of claim A3 where: said functionality comprises a difference equation i[n]=C(v[n]−v[n−1])/T for a preferentially negative capacitance C, relating desired port current i[n] to digitized port voltage v[n], when the sampling period is T for both the digital-to-analog converter and the analog-to-digital converter.

The method of claim A3 where: said functionality comprises a difference equation i[n]=i[n−1]+Tv[n]/L for a preferentially negative inductance L, relating desired port current i[n] to digitized port voltage v[n], when the sampling period is T for both the digital-to-analog converter and the analog-to-digital converter.

The method of claim A3 where: said functionality comprises a convolution relating desired port current i[n] to digitized port voltage v[n], where i[n]=v[n]*h[n], with * denoting convolution, where impulse response h[n] has z-transform H(z), and where H(z)=2C(z−1)/{(z+1)T} for a preferentially negative capacitance C, when the sampling period is T for both the digital-to-analog converter and the analog-to-digital converter.

The method of claim A3 where: said functionality comprises a convolution relating desired port current i[n] to digitized port voltage v[n], where i[n]=v[n]*h[n], with * denoting convolution, where impulse response h[n] has z-transform H(z), and where H(z)=T(z+1)/{2L (z−1)} for a preferentially negative inductance L, when the sampling period is T for both the digital-to-analog converter and the analog-to-digital converter.

The method of claim A3 where: said functionality includes an adaptive method for determining the initial external impedance Ze(s) seen by the port by first generating a current impulse using said digital-to-analog converter, measuring the impulse response voltage using said analog-to-digital converter, taking Ze(s)=v(nT)e−nsT, then computing desired processing functionality H(z)={(Ze(s)−ZT(s))/(Ze(s)ZT(s))}|s=(2/T)(z−1)/(z+1), where ZT(s) is the desired the total impedance at the port.

The method of claim A8 where: said functionality includes an adaptive method for determining the external impedance Ze(s) seen by the port by using a pseudorandom current instead of said current impulse.

The method of claim A2 where: said digitizing consists of digitizing the current at the port of a component having only one port; said processing consists of calculating the desired voltage at said port; said processing to include functionality comprising convolution or difference equations; and converting, using a digital-to-analog converter, the calculated desired voltage to output signal at said port.

The method of claim A10 where: said functionality comprises a difference equation v[n]=L(v[n]−i[n−1])/T for a preferentially negative inductance L, relating desired port voltage v[n] to digitized port current i[n], when the sampling period is T for both the digital-to-analog converter and the analog-to-digital converter.

The method of claim A10 where: said functionality comprises a difference equation v[n]=v[n−1]+T i[n]/C for a preferentially negative capacitance C, relating desired port voltage v[n] to digitized port current i[n], when the sampling period is T for both the digital-to-analog converter and the analog-to-digital converter.

The method of claim A10 where: said functionality comprises a convolution relating desired port voltage v[n] to digitized port current i[n], where i[n]=v[n]*h[n], with * denoting convolution, where impulse response h[n] has z-transform H(z), and where H(z)=2L (z−1)/{(z+1)T} for a preferentially negative inductance L, when the sampling period is T for both the digital-to-analog converter and the analog-to-digital converter.

The method of claim A10 where: said functionality comprises a convolution relating desired port voltage v[n] to digitized port current i[n], where i[n]=v[n]*h[n], with * denoting convolution, where impulse response h[n] has z-transform H(z), and where H(z)=T (z+1)/{2C(z−1)} for a preferentially negative capacitance C, when the sampling period is T for both the digital-to-analog converter and the analog-to-digital converter.

The method of claim A10 where: said functionality includes an adaptive method for determining the initial external impedance Ze(s) seen by the port by first generating a voltage impulse using said digital-to-analog converter, measuring the impulse response current using said analog-to-digital converter, then computing desired processing functionality H(z).

The method of claim A15 where: said functionality includes an adaptive method for determining the external impedance Ze(s) seen by the port by using a pseudorandom current instead of said current impulse.

The method of claim A2 where: said digitizing consists of digitizing the voltages at every port of a component having two or more ports; said processing consists of calculating the desired current at every one of said ports; said processing to include functionality comprising an z-transform admittance matrix Y(z); and converting, using a digital-to-analog converter, the calculated desired currents to output signal at every one of said ports.

The method of claim A2 where: said digitizing consists of digitizing the currents at every port of a component having two or more ports; said processing consists of calculating the desired voltages at every one of said ports; said processing to include functionality comprising an z-transform impedance matrix Z(z); and converting, using a digital-to-analog converter, the calculated desired voltages to output signal at every one of said ports.

The method of claim A3 where: said functionality comprises any difference equation relating desired port current i[n] to digitized port voltage v[n], when the sampling period is T for both the digital-to-analog converter and the analog-to-digital converter.

The method of claim A10 where: said functionality comprises any difference equation relating desired port voltage v[n] to digitized port voltage i[n], when the sampling period is T for both the digital-to-analog converter and the analog-to-digital converter.

The method of claim A17 where: said functionality comprises any desired z-transform admittance matrix Y(z).

The method of claim A19 where: said functionality comprises any desired z-transform impedance matrix Z(z).

The method of claim A17 where: said functionality includes an adaptive method for determining the initial external impedance Ze(s) seen by one or more ports by first generating a current impulse using said digital-to-analog converters, measuring the impulse response current using said analog-to-digital converters, then computing desired processing functionality Y(z).

The method of claim A25 where: said functionality includes an adaptive method for determining the external impedance Ze(s) seen by the port by using a pseudorandom current instead of said current impulse.

The method of claim A19 where: said functionality includes an adaptive method for determining the initial external impedance Ze(s) seen by one or more ports by first generating a voltage impulse using said digital-to-analog converters, measuring the impulse response current using said analog-to-digital converters, then computing desired processing functionality Z(z).

The method of claim A27 where: said functionality includes an adaptive method for determining the external impedance Ze(s) seen by the port by using a pseudorandom current instead of said current impulse.

The method of claim A1 where: said functionality comprises any difference equation relating desired port current i[n] to digitized port voltage v[n], when the sampling period is T for all of the digital-to-analog converters and the analog-to-digital converters.

The method of claim A1 where: said functionality comprises any desired z-transform admittance matrix Y(z).

The method of claim A1 where: said functionality comprises any desired z-transform impedance matrix Z(z).

The method of claim A1 where: said functionality includes an adaptive method for determining the initial external impedance Ze(s) seen by one or more ports by first generating a current or voltage impulse using said digital-to-analog converters, measuring the impulse response currents or voltages using said analog-to-digital converters, then computing desired processing functionality Y(z) or Z(z).

The method of claim A32 where: said functionality includes an adaptive method for determining the external impedance Ze(s) seen by the port by using a pseudorandom current instead of said current impulse.

The method of claim A2 where: signals are forces, temperatures, pressures, velocity, position, torque, or flow rate.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to embodiments of the invention in the form disclosed. Many modifications and variations will be apparent to those of ordinary skill in the art without departing from the scope and spirit of embodiments of the invention. The embodiment was chosen and described in order to best explain the principles of embodiments of the invention and the practical application, and to enable others of ordinary skill in the art to understand embodiments of the invention for various embodiments with various modifications as are suited to the particular use contemplated.

Although specific embodiments have been illustrated and described herein, those of ordinary skill in the art appreciate that any arrangement which is calculated to achieve the same purpose may be substituted for the specific embodiments shown and that embodiments of the invention have other applications in other environments. This application is intended to cover any adaptations or variations of the present invention. The following claims are in no way intended to limit the scope of embodiments of the invention to the specific embodiments described herein.

What is claimed is:

1. A method to implement a circuit having one or more ports, comprising:
digitizing, by an analog-to-digital converter (ADC), a continuous-time voltage signal of a port of a circuit to form a discrete-time input voltage signal;
monitoring, by a digital signal processor (DSP), the discrete-time input voltage signal;
calculating, by the DSP, a discrete-time output current signal based on the monitored discrete-time input voltage signal in order to produce an impedance desired at the port;
outputting, by the DSP, the calculated discrete-time output current signal;
converting, by a digital-to-analog converter (DAC) directly connected to the port, the calculated discrete-time output current signal to a continuous-time output current signal;
setting, by the DAC, the continuous-time output current signal at the port having the continuous-time input voltage signal wherein there is no summing or subtraction of current at the port, said continuous-time output current signal being the current of the port.

2. The method of claim 1, wherein the digital signal processor performs processing having functionality of at least one of convolution, difference equations, admittance matrices, impedance matrices, nonlinearity, adaptive control, adaptive stabilization, and time-variance.

3. The method of claim 2 wherein:
said digitizing comprises digitizing the continuous-time input voltage signal at the port of a component having only one port to form the discrete-time input voltage signal v[n];
said processing comprises calculating the discrete-time output current signal i[n] that determines current for the one port;
said processing includes functionality comprising convolution or difference equations; and
said converting comprises converting the discrete-time output current signal i[n] to form a continuous-time output current signal at said one port.

4. The method of claim 3 where:
said functionality comprises at least one of:
a difference equation i[n]=C(v[n]−v[n−1])/T for a preferentially negative capacitance C, relating the discrete-time output current signal i[n] to the digitized discrete-time input voltage signal v[n], when the sampling period is T for both the digital-to-analog converter and the analog-to-digital converter;
a difference equation i[n]=i[n−1]+T v[n]/L for a preferentially negative inductance L, relating the discrete-time output current signal i[n] to the digitized discrete-time input voltage signal v[n], when the sampling period is T for both the digital-to-analog converter and the analog-to-digital converter;
a convolution relating the discrete-time output current signal i[n] to the digitized discrete-time input voltage signal v[n], where i[n]=v[n]*h[n], with * denoting convolution, where impulse response h[n] has z-transform H(z), and where H(z) =2C (z−1)/{(z+1) T} for a preferentially negative capacitance C, when the sampling period is T for both the digital-to-analog converter and the analog-to-digital converter;
a convolution relating the discrete-time output current signal i[n] to the digitized discrete-time input voltage signal v[n], where i[n]=v[n]*h[n], with * denoting convolution, where impulse response h[n] has z-transform H(z), and where H(z)=T(z +1)/{2L(z−1)} for a preferentially negative inductance L, when the sampling period is T for both the digital-to-analog converter and the analog-to-digital converter;
an adaptive method for determining the initial external impedance $Z_e(s)$ seen by the port by first generating a current impulse using said digital-to-analog converter, measuring the impulse response voltage using said analog-to-digital converter, taking $Z_e(s) = \Sigma v(nT)e^{-nsT}$, then computing processing functionality $H(z)=\{(Z_e(s)-Z_T(s))/(Z_e(s) Z_T(s))\}|_{s=(2/T)(Z+1)}$, where $Z_T(s)$ is the total impedance at the port.

5. The method of claim 4 where:
said functionality includes an adaptive method for determining the external impedance Ze(s) seen by the port by using a pseudorandom current instead of said current impulse.

6. The method of claim 2 where:
said digitizing comprises digitizing the continuous-time input voltage signal at every port of the circuit to form respective discrete-time input signals, wherein the one or more ports comprises at least two or more ports;
said processing comprises calculating the discrete-time output signals that determine respective currents at every one of said at least two or more ports;
said processing to include functionality comprising an z-transform admittance matrix Y(z); and
said converting, comprises converting each respective discrete-time output signals to form respective continuous-time output current signals at every respective port of said at least two or more ports,
said continuous-time output current signals being the respective currents of the ports.

7. The method of claim 6 where:
said functionality comprises any difference equation relating the discrete-time output current signal i[n] at any port to the digitized discrete-time input voltage signal v[n] at any port, when the sampling period is T for both the digital-to-analog converter and the analog-to-digital converter.

8. The method of claim 6 where:
said functionality comprises one of: any z-transform admittance matrix Y(z) and any z-transform impedance matrix Z(z).

9. The method of claim 8 where:
said functionality includes an adaptive method for determining the initial external impedance $Z_e(s)$ seen by one or more ports by first generating a current impulse using said digital-to-analog converter at any port, measuring an impulse response voltage using said analog-to-digital converter at any port, then computing processing functionality Y(z).

10. The method of claim 6 where:
said functionality comprises at least one of:
a z-transform admittance matrix Y(z) with $$Y(z) = \begin{bmatrix} \frac{C}{T}(1-z^{-1}) & -\frac{C}{T}(1-z^{-1}) \\ -\frac{C}{T}(1-z^{-1}) & \frac{C}{T}(1-z^{-1}) \end{bmatrix}$$

for a preferentially negative capacitance C, when the sampling period is T for the digital-to-analog converter and the analog-to-digital converter; and
a z-transform admittance matrix Y(z) with $$Y(z) = \begin{bmatrix} \frac{2C(z-1)}{T(z+1)} & -\frac{2C(z-1)}{T(z+1)} \\ -\frac{2C(z-1)}{T(z+1)} & \frac{2C(z-1)}{T(z+1)} \end{bmatrix}$$

for a preferentially negative capacitance C, when the sampling period is T for the digital-to-analog converter and the analog-to-digital converter.

11. The method of claim 2 where:
said functionality includes an adaptive method for determining the initial external impedance $Z_e(s)$ seen by the port by first generating a current impulse using said digital-to-analog converter, measuring the impulse response voltage using said analog-to-digital converter, then computing processing functionality Z(z).

12. The method of claim 11 where:
said functionality includes an adaptive method for determining the external impedance Ze(s) seen by the port by using a pseudorandom current instead of said current impulse.

13. The method of claim 2 where:
said functionality comprises at least one of:
   any z-transform admittance matrix Y(z).
   any z-transform impedance matrix Z(z).
   any difference equation relating the port current signal i[n] at any port to the digitized port voltage signal v[n] at any port, when the sampling period is T for the digital-to-analog converter and the analog-to-digital converter.

14. The method of claim 2 where:
said functionality includes an adaptive method for determining the initial external impedance $Z_e(s)$ seen by one or more ports by first generating a current or voltage impulse using said digital-to-analog converter at any port, measuring an impulse response using said analog-to-digital converter at any port, then computing processing functionality Y(z) or Z(z).

15. The method of claim 1 wherein:
at least one of the signals comprises forces, temperatures, pressures, velocity, position, torque, or flow rate.

16. An apparatus to implement a circuit having one or more ports, comprising:
   a port of a circuit having a port voltage;
   an analog-to-digital converter connected to the port to convert the port voltage at the port of the circuit into a discrete-time input voltage;
   a digital signal processor to monitor the discrete-time input voltage, compute a discrete-time output current based on the monitored discrete-time input voltage in order to generate an impedance desired at the port, and output the calculated discrete-time output current signal; and
   a digital-to-analog converter connected to the port to convert the discrete-time output current to set the continuous-time output current signal at the port so that the only current entering or leaving the port is the continuous-time output current signal that is set by the DAC.

17. A method to implement a circuit having one or more ports, comprising:
   digitizing, by an analog-to-digital converter (ADC), a continuous-time current signal of a port of a circuit to form a discrete-time input current signal;
   monitoring, by a digital signal processor (DSP), the discrete-time input current signal;
   calculating, by the DSP, a discrete-time output voltage signal based on the monitored discrete-time current voltage signal in order to produce an impedance desired at the port;
   outputting, by the DSP, the calculated discrete-time output voltage signal;
   converting, by a digital-to-analog converter (DAC), the calculated discrete-time output voltage signal to a continuous-time output voltage signal; and
   setting, by the DAC, the continuous-time output voltage signal at the port having the continuous-time input current signal wherein there is no summing of voltage and there is no subtraction of voltage at the port, said continuous-time output voltage being the voltage of the port.

18. The method of claim 17 wherein said functionality of the digital signal processor comprises one of:
   a difference equation v[n]=L (i[n]−i[n−1])/T for a preferentially negative inductance L, relating discrete-time output signal port voltage v[n] to digitized discrete-time input signal port current i[n], when the sampling period is T for both the digital-to-analog converter and the analog-to-digital converter;
   a difference equation v[n]=v[n−1]+T i[n]/C for a preferentially negative capacitance C, relating discrete-time output signal port voltage v[n] to digitized discrete-time input signal port current i[n], when the sampling period is T for both the digital-to-analog converter and the analog-to-digital converter;
   a convolution relating discrete-time output signal port voltage v[n] to digitized discrete-time input signal port current i[n], where v[n]=i[n]*h[n], with * denoting convolution, where impulse response h[n] has z-transform H(z), and where H(z)=2L(z−1)/{(z+1)T} for a preferentially negative inductance L, when the sampling period is T for both the digital-to-analog converter and the analog-to-digital converter;
   a convolution relating discrete-time output signal port voltage v[n] to digitized discrete-time input signal port current i[n], where v[n]=i[n]*h[n], with * denoting convolution, where impulse response h[n] has z-transform H(z), and where H(z)=T(z +1)/{2C(z−1)} for a preferentially negative capacitance C, when the sampling period is T for both the digital-to-analog converter and the analog-to-digital converter; and
   an adaptive method for determining the initial external impedance $Z_e(s)$ seen by the port by first generating a voltage impulse using said digital-to-analog converter, measuring the impulse response current using said analog-to-digital converter, then computing processing functionality H(z).

19. The method of claim 17 wherein:
said digitizing comprises digitizing respective continuous-time input current signals at every port of the circuit to form respective discrete-time input signals, wherein the one or more ports comprises at least two or more ports;
said processing comprises calculating discrete-time output voltage signals that determine respective voltages at every one of said two or more ports;
said processing to include functionality comprising a z-transform impedance matrix Z(z); and
said converting comprises converting each respective discrete-time output signal to form respective continuous-time output voltage signals at every respective port of said at least two or more ports,
said continuous-time output voltage signals being the voltages of the ports.

20. The method of claim 19 wherein:
functionality of the digital signal processor comprises at least one of:
a z-transform impedance matrix Z(z) with $$Z(z) = \begin{bmatrix} \frac{L}{T}(1-z^{-1}) & -\frac{L}{T}(1-z^{-1}) \\ -\frac{L}{T}(1-z^{-1}) & \frac{L}{T}(1-z^{-1}) \end{bmatrix}$$

for a preferentially negative inductance L, when the sampling period is T for all of the digital-to-analog converters and the analog-to-digital converters; and a z-transform impedance matrix $Z(z)$ with $$Z(z) = \begin{bmatrix} \dfrac{2L(z-1)}{T(z+1)} & -\dfrac{2L(z-1)}{T(z+1)} \\ -\dfrac{2L(z-1)}{T(z+1)} & \dfrac{2L(z-1)}{T(z+1)} \end{bmatrix}$$

for a preferentially negative inductance L, when the sampling period is T for each digital-to-analog converter and each analog-to-digital converter.

\* \* \* \* \*